(12) United States Patent
Yamazaki et al.

(10) Patent No.: US 9,276,129 B2
(45) Date of Patent: Mar. 1, 2016

(54) SEMICONDUCTOR DEVICE IN WHICH OXYGEN DEFICIENCY IN SEMICONDUCTOR IS REDUCED AND METHOD FOR MANUFACTURING THE SAME

(71) Applicant: Semiconductor Energy Laboratory Co., Ltd., Atsugi-shi, Kanagawa-ken (JP)

(72) Inventors: Shunpei Yamazaki, Setagaya (JP); Yuta Endo, Atsugi (JP)

(73) Assignee: SEMICONDUCTOR ENERGY LABORATORY CO., LTD., Kanagawa-ken (JP)

( * ) Notice: Subject to any disclaimer, the term of this patent is extended or adjusted under 35 U.S.C. 154(b) by 0 days.

(21) Appl. No.: 14/534,220

(22) Filed: Nov. 6, 2014

(65) Prior Publication Data

US 2015/0123122 A1 May 7, 2015

Related U.S. Application Data

(62) Division of application No. 13/911,502, filed on Jun. 6, 2013, now Pat. No. 8,884,294, which is a division of application No. 13/151,490, filed on Jun. 2, 2011, now abandoned.

(30) Foreign Application Priority Data

Jun. 11, 2010 (JP) ................... 2010-134338

(51) Int. Cl.
*H01L 29/786* (2006.01)
*H01L 51/05* (2006.01)
(Continued)

(52) U.S. Cl.
CPC ............ *H01L 29/7869* (2013.01); *H01L 22/10* (2013.01); *H01L 23/564* (2013.01);
(Continued)

(58) Field of Classification Search
CPC .................................................. H01L 51/0516
See application file for complete search history.

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| CN | 101567390 A | 10/2009 |
| CN | 101685835 A | 3/2010 |

(Continued)

OTHER PUBLICATIONS

Chinese Office Action (Application No. 201180028560.2) Dated Feb. 28, 2015.

(Continued)

*Primary Examiner* — Lex Malsawma
(74) *Attorney, Agent, or Firm* — Robinson Intellectual Property Law Office; Eric J. Robinson

(57) ABSTRACT

An object of an embodiment of the present invention is to manufacture a highly-reliable semiconductor device comprising a transistor including an oxide semiconductor, in which change of electrical characteristics is small. In the transistor including an oxide semiconductor, oxygen-excess silicon oxide ($SiO_X(X>2)$) is used for a base insulating layer of a top-gate structure or for a protective insulating layer of a bottom-gate structure. By using the oxygen-excess silicon oxide, oxygen is discharged from the insulating layer, and oxygen deficiency of an oxide semiconductor layer and the interface state density between the oxide semiconductor layer and the base insulating layer or the protective insulating layer can be reduced, so that the highly-reliable semiconductor device in which change of electrical characteristics is small can be manufactured.

18 Claims, 16 Drawing Sheets

(51) Int. Cl.
    *H01L 29/66*     (2006.01)
    *H01L 21/66*     (2006.01)
    *H01L 23/00*     (2006.01)

(52) U.S. Cl.
    CPC .... *H01L29/66742* (2013.01); *H01L 29/66969* (2013.01); *H01L 29/78606* (2013.01); *H01L 2924/0002* (2013.01)

(56) References Cited

U.S. PATENT DOCUMENTS

| | | | |
|---|---|---|---|
| 6,281,552 B1 | 8/2001 | Kawasaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,803,275 B1 | 10/2004 | Park et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 * | 3/2010 | Akimoto ............ H01L 27/1225 257/E21.347 | |
| 7,732,819 B2 | 6/2010 | Akimoto et al. | |
| 7,791,072 B2 | 9/2010 | Kumomi et al. | |
| 8,115,201 B2 | 2/2012 | Yamazaki et al. | |
| 8,129,717 B2 | 3/2012 | Yamazaki et al. | |
| 8,343,817 B2 | 1/2013 | Miyairi et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2004/0263751 A1 | 12/2004 | Kim et al. | |
| 2005/0017302 A1 | 1/2005 | Hoffman | |
| 2005/0133917 A1* | 6/2005 | Hoffman et al. .............. 257/749 | |
| 2005/0199959 A1 | 9/2005 | Chiang et al. | |
| 2005/0285233 A1 | 12/2005 | Huang et al. | |
| 2006/0035452 A1 | 2/2006 | Carcia et al. | |
| 2006/0043377 A1 | 3/2006 | Hoffman et al. | |
| 2006/0051554 A1* | 3/2006 | Kumakura ............ C30B 25/18 428/98 | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1* | 2/2007 | Shin .................... H01L 51/5281 313/504 | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1* | 5/2007 | Akimoto ........... H01L 29/41733 257/61 | |
| 2007/0152217 A1* | 7/2007 | Lai ...................... H01L 27/1225 257/59 | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0253728 A1 | 10/2008 | Sparacin et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0283933 A1* | 11/2008 | JangJian ........... H01L 21/02129 257/384 | |
| 2008/0296568 A1 | 12/2008 | Ryu et al. | |
| 2008/0299702 A1 | 12/2008 | Son et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0025675 A1 | 2/2010 | Yamazaki et al. | |
| 2010/0051940 A1* | 3/2010 | Yamazaki et al. ............... 257/43 | |
| 2010/0055347 A1 | 3/2010 | Kato et al. | |
| 2010/0065844 A1 | 3/2010 | Tokunaga | |
| 2010/0092800 A1 | 4/2010 | Itagaki et al. | |
| 2010/0102312 A1 | 4/2010 | Yamazaki et al. | |
| 2010/0109002 A1 | 5/2010 | Itagaki et al. | |
| 2010/0117075 A1 | 5/2010 | Akimoto et al. | |
| 2010/0123132 A1 | 5/2010 | Nakata et al. | |
| 2010/0295041 A1 | 11/2010 | Kumomi et al. | |
| 2010/0304019 A1 | 12/2010 | Baron et al. | |
| 2011/0095288 A1 | 4/2011 | Morosawa et al. | |
| 2011/0284844 A1 | 11/2011 | Endo et al. | |
| 2011/0284845 A1 | 11/2011 | Endo et al. | |
| 2011/0284846 A1 | 11/2011 | Endo et al. | |
| 2011/0284847 A1 | 11/2011 | Endo et al. | |

FOREIGN PATENT DOCUMENTS

| | | |
|---|---|---|
| EP | 1737044 A | 12/2006 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |

(56) References Cited

FOREIGN PATENT DOCUMENTS

| | | |
|---|---|---|
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-042088 A | 2/2008 |
| JP | 2010-016163 A | 1/2010 |
| JP | 2010-056546 A | 3/2010 |
| JP | 2010-123758 A | 6/2010 |
| WO | WO-2004/114391 | 12/2004 |

OTHER PUBLICATIONS

Fortunato.E et al., "Wide-Bandgap High-Mobility ZnO Thin-Film Transistors Produced At Room Temperature", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Nakamura.M et al., "The phase relations in the In2O3—Ga2ZnO4—ZnO system at 1350° C", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5, InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor", Science, May 23, 2003, vol. 300, No. 5623, pp. 1269-1272.

Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group", Journal of Solid State Chemsitry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digset of Technical Papers, May 20, 2008, vol. 39, No. 1, pp. 1-4.

Park.J et al., "High performance amorphous oxide thin film transistors with self-aligned top-gate structure", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems", Journal of Solid-State Circuits, 2008, vol. 43, No. 1, pp. 292-299.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blye Phase"", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane", SID Digest '09 : SID International Symposium Digest of Technical Papers, May 31, 2009 pp. 280-283.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Propertoes", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs", IDW '09 : Proceedings of the 16th International Display Workshops, 2009, pp. 689-692.

Park.J et al., "Amorphous Indium—Gallium—Zinc Oxide Tfts and Their Application for Large Size AMOLED", AM-FPD '08 Digest of Technical Papers, Jul. 2, 2008, pp. 275-278.

Park.S et al., "Challenge to Future Displays: Transparent AM-OLED Driven by Peald Grown ZnO TFT", IMID '07 Digest, 2007, pp. 1249-1252.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

(56) References Cited

OTHER PUBLICATIONS

Osada.T et al., "Development of Driver-Integrated Panel Using Amorphous In—Ga—Zn—Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT", SID Digest '09 : SID Internatinoal Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Paper, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical papers, May 31, 2009, pp. 578-581.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED", IDW '06 : Proceedings of the 13th International Display Workshops, Dec. 7, 2006, pp. 663-666.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", Nirim Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C"Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Red. A (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium—Gallium—Zinc Oxide Semiconductor Upon Exposure to Water", Appl. Phys. Lett. (Applied Physics Letters) , 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digset of Technical Papers, May 20, 2008, vol. 39, pp. 1277-1280.
Janotti.A et al., "Oxygen Vacancies in ZnO", Appl. Phys. Lett. (Applied Physics Letters) , 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m <4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clarks et al., "First Principles Methods Using Castep", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.
Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.
International Search Report (Application No. PCT/JP2011/063085) Dated Sep. 6, 2011.
Written Opinion (Application No. PCT/JP2011/063085) Dated Sep. 6, 2011.
Morgan.D et al., "An Investigation of the Stoichiometry and Impurity Content of Thin Silion Oxide Films Using Rutherford Scattering of MeV a-Particles", Physica Status Solida (a), 1972, vol. 13, pp. 517-526.

\* cited by examiner

SEMICONDUCTOR DEVICE IN WHICH OXYGEN DEFICIENCY IN SEMICONDUCTOR IS REDUCED AND METHOD FOR MANUFACTURING THE SAME

TECHNICAL FIELD

The present invention relates to a semiconductor device and a method for manufacturing the semiconductor device.

Note that a semiconductor device in this specification refers to all electronic devices which can function by utilizing semiconductor characteristics, and electro-optical devices, semiconductor circuits, and electronic devices are all semiconductor devices.

BACKGROUND ART

A technique by which transistors are formed using semiconductor thin films formed over a substrate having an insulating surface has been attracting attention. The transistor is applied to a wide range of electronic devices such as an integrated circuit (IC) or an image display device (display device). A silicon-based semiconductor material is widely known as a material for a semiconductor thin film applicable to the transistor; in addition, an oxide semiconductor has been attracting attention as another material.

For example, a transistor whose active layer uses an amorphous oxide containing indium (In), gallium (Ga), and zinc (Zn) and having an electron carrier concentration of less than $10^{18}/cm^3$ is disclosed (see Patent Document 1).

A transistor including an oxide semiconductor is known to have a problem of low reliability because of high possibility of change in electric characteristics, although the transistor including an oxide semiconductor can be operated at higher speed than a transistor including amorphous silicon and can be manufactured more easily than a transistor including polycrystalline silicon. For example, the threshold voltage of the transistor is changed after light irradiation or a bias-temperature stress test (BT test). Note that in this specification, the threshold voltage refers to a gate voltage which is necessary for turning a transistor on. The gate voltage refers to a potential difference between a source and a gate when the potential of the source is used as a reference potential.

REFERENCE

Patent Document

[Patent Document 1] Japanese Published Patent Application No. 2006-165528

DISCLOSURE OF INVENTION

Change in the threshold voltage of a transistor including an oxide semiconductor due to light irradiation or a BT test considerably decreases the reliability of the transistor including an oxide semiconductor. Thus, an object of an embodiment of the present invention is to improve the reliability of a semiconductor device including an oxide semiconductor.

An embodiment of the present invention is a semiconductor or a method for manufacturing the semiconductor device, which is based on the technical idea that oxygen-excess silicon oxide ($SiO_X$ (X>2)) is used for a base insulating layer or a protective insulating layer in contact with an oxide semiconductor layer in a transistor including an oxide semiconductor. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

Note that in a conventional transistor including an oxide semiconductor, the purity of an oxide semiconductor layer is low, electrical characteristics became unstable in some cases, for example, due to influence of hydrogen, moisture, or the like in the oxide semiconductor or influence of oxygen deficiency in the oxide semiconductor.

In such a transistor, when positive voltage is applied to a gate electrode, hydrogen ions with positive charge which exist in the oxide semiconductor layer are transferred to a back channel side (a side opposite to a side where a gate insulating layer is formed) and accumulated on an oxide semiconductor layer side of an interface between the oxide semiconductor layer and an insulating layer provided on the back channel side. The positive charge is transferred from the accumulated hydrogen ions to charge trapping centers (such as a hydrogen atom, water, or contamination) in the insulating layer, whereby negative charge is accumulated at the back channel side of the oxide semiconductor layer. In other words, a parasitic channel is generated in the back channel side of the transistor, and the threshold voltage shifts to the negative side, so that the transistor tends to be normally on.

Thus, in order to suppress change in the electrical characteristics of the transistor, it is important that the insulating layer includes no impurities which serve as the charge trapping centers, or that the content of the impurities is extremely small. When the insulating layer includes no impurities which serve as the charge trapping centers or the content of the impurities is extremely small, positive charge is not easily transferred and shift of the threshold voltage of the transistor is suppressed, so that the transistor can be normally off.

In addition, when negative voltage is applied to the gate electrode, hydrogen ions which exist in the oxide semiconductor layer are transferred to the gate insulating layer side and accumulated in the oxide semiconductor layer side of the interface between the oxide semiconductor layer and the gate insulating layer. As a result, the threshold voltage of the transistor shifts to the negative side.

Note that application of the voltage to the gate electrode is stopped and the transistor is left, the positive charge is released from the charge trapping center and the threshold voltage of the transistor shifts to the positive side, thereby returning to the initial state, or shifts to the positive side beyond the initial state. These phenomena indicate the existence of easy-to-transfer ions in the oxide semiconductor layer. It can be considered that an ion that is transferred most easily is a hydrogen ion that is the smallest atom.

Note that in a bottom-gate transistor, when an oxide semiconductor layer is formed over a gate insulating layer and then heat treatment is performed thereon, not only water or hydrogen contained in the oxide semiconductor layer but also water or hydrogen contained in the gate insulating layer can be removed. Accordingly, the gate insulating layer includes a small number of charge trapping centers.

When the oxide semiconductor layer is irradiated with light having an optical energy of a given amount or more, a bond of a metal element (M) and a hydrogen atom (H) (also referred to as an M-H bond) in the oxide semiconductor layer can be cut. Note that the optical energy having a wavelength of approximately 400 nm equals or substantially equals to the bond energy of a metal element and a hydrogen atom. When a negative gate bias is applied to a transistor in which a bond of a metal element and a hydrogen atom in an oxide semiconductor layer is cut, a hydrogen ion detached from a metal element is attracted to a gate electrode side, so that distribution of charge is changed, the threshold voltage of the transistor shifts to the negative side, and the transistor tends to be normally on.

Note that hydrogen ions which are transferred to the interface with a gate insulating layer by light irradiation and application of the negative gate bias to the transistor are returned to the initial state by stopping application of the voltage. This can be regarded as a typical example of the ion transfer in the oxide semiconductor layer.

In order to reduce such change in the electric characteristics by voltage application (BT degradation) or change in the electric characteristics by light irradiation (light degradation), it is effective to remove a hydrogen atom or an impurity containing a hydrogen atom such as water thoroughly from an oxide semiconductor layer to highly purify the oxide semiconductor layer.

The charge density as small as $1 \times 10^{15}$ cm$^{-3}$ in the oxide semiconductor layer, or the charge per unit area which is as small as $1 \times 10^{10}$ cm$^2$ does not affect the transistor characteristics or very slightly affects them. Therefore, it is preferable that the charge density be less than or equal to $1 \times 10^{15}$ cm$^{-3}$.

Note that an oxygen atom (O) and a hydrogen atom (H) are coupled and stabilized by supplying oxygen into the oxide semiconductor layer. Thus, it is preferable that oxygen-excess silicon oxide ($SiO_X$ (X>2)) be used for a base insulating layer or a protective insulating layer which is in contact with the oxide semiconductor layer in the back channel side. The oxygen-excess silicon oxide can supply oxygen into the oxide semiconductor layer or its interface. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry.

As for silicon oxide, it is generally known that $SiO_X$ (X=2) is chemically stable. In the case of $SiO_X$ (X>2), an excess of oxygen over the stoichiometric proportion is easily discharged to the outside by application of energy such as heat.

An embodiment of the present invention is a semiconductor device or a method for manufacturing the semiconductor device, which is based on the technical idea that oxygen-excess silicon oxide ($SiO_X$ (X>2)) is used for a base insulating layer in a top-gate transistor including an oxide semiconductor.

By using the oxygen-excess silicon oxide ($SiO_X$ (X>2)) for the base insulating layer, charge or the like which can be caused by the operation of a semiconductor device or the like can be sufficiently prevented from being trapped at the interface between the base insulating layer and the oxide semiconductor layer. This effect results from a reduction of the interface state density of the oxide semiconductor layer and the base insulating layer by an excess of oxygen over the stoichiometric proportion in the base insulating layer.

In other words, although it is difficult to suppress trapping of charge at the interface between the base insulating layer and the oxide semiconductor layer when oxygen deficiency is generated in the oxide semiconductor layer, by using oxygen-excess silicon oxide ($SiO_X$ (X>2)) for the base insulating layer, an excess of oxygen over the stoichiometric proportion reduces the interface state density and the oxygen deficiency of the oxide semiconductor layer, and influence of the trapping of charge at the interface between the oxide semiconductor layer and the base insulating layer can be reduced.

In some cases, charge may be generated due to the oxygen deficiency of the oxide semiconductor layer. Generally, oxygen deficiency in an oxide semiconductor layer serves as a donor to generate an electron that is a carrier. As a result, the threshold voltage of a transistor shifts in the negative direction. However, oxygen is supplied from the base insulating layer to the oxygen deficiency in the oxide semiconductor layer, thereby suppressing shift of the threshold voltage in the negative direction.

In this manner, an effect according to an embodiment of the present invention results from the use of oxygen-excess silicon oxide ($SiO_X$ (X>2)) for the base insulating layer.

By the above-described effect of suppressing the trapping of charge at the interface between the base insulating layer and the oxide semiconductor layer, a malfunction such as increase of off-state current of the transistor including an oxide semiconductor or change in the threshold voltage can be suppressed and, in addition, the reliability of the semiconductor device can be improved.

Note that the base insulating layer preferably has a sufficient thickness with respect to the oxide semiconductor layer. This is because supply of oxygen to the oxide semiconductor layer may be insufficient when the base insulating layer is thin with respect to the oxide semiconductor layer. The phrase "having a sufficient thickness" means that a silicon oxide film has a thickness greater than 100 nm.

An embodiment of the present invention is a semiconductor device including a base insulating layer, an oxide semiconductor layer, a source electrode and a drain electrode which are electrically connected to the oxide semiconductor layer, a gate insulating layer part of which is in contact with the oxide semiconductor layer, and a gate electrode over the gate insulating layer. Oxygen-excess silicon oxide ($SiO_X$ (X>2)) is used for the base insulating layer.

In the above structure, a protective insulating layer covering the gate insulating layer and the gate electrode may be included. In addition, a conductive layer may be provided below the oxide semiconductor layer.

An embodiment of the present invention is a semiconductor device or a method for manufacturing the semiconductor device, which is based on the technical idea that oxygen-excess silicon oxide ($SiO_X$ (X>2)) is used for a protective insulating layer in a bottom-gate transistor including an oxide semiconductor.

By using the oxygen-excess silicon oxide ($SiO_X$ (X>2)) for the protective insulating layer, charge or the like caused by the operation of a semiconductor device or the like can be sufficiently prevented from being trapped at the interface between the protective insulating layer and the oxide semiconductor layer. This effect results from a reduction of the interface state density between the oxide semiconductor layer and the protective insulating layer by an excess of oxygen over the stoichiometric proportion in the protective insulating layer.

In other words, although it is difficult to suppress trapping of charge at the interface between the protective insulating layer and the oxide semiconductor layer when oxygen deficiency is generated in the oxide semiconductor layer, by using oxygen-excess silicon oxide ($SiO_X$ (X>2)) for the protective insulating layer, an excess of oxygen over the stoichiometric proportion reduces the interface state density and the oxygen deficiency of the oxide semiconductor layer, and influence of the trapping of charge at the interface between the oxide semiconductor layer and the protective insulating layer can be reduced.

In this manner, an effect according to an embodiment of the present invention results from the use of oxygen-excess silicon oxide ($SiO_X$ (X>2)) for the protective insulating layer.

By the above-described effect of suppressing the trapping of charge at the interface between the protective insulating layer and the oxide semiconductor layer, a malfunction such as increase of off-state current of the transistor including oxide semiconductor or change in the threshold voltage can be suppressed and the reliability of the semiconductor device can be improved.

Note that the protective insulating layer preferably has a sufficient thickness with respect to the oxide semiconductor layer. This is because supply of oxygen to the oxide semiconductor may be insufficient when the protective insulating layer is thin with respect to the oxide semiconductor layer.

An embodiment of the present invention is a semiconductor device including a base insulating layer; a gate electrode; a gate insulating layer; an oxide semiconductor layer over the gate electrode with the gate insulating layer provided therebetween; a source electrode and a drain electrode which are electrically connected to the oxide semiconductor layer; and a protective insulating layer part of which is in contact with the oxide semiconductor layer, over the source drain electrode and the drain electrode. Oxygen-excess silicon oxide ($SiO_X$ (X>2)) is used for the protective insulating layer.

In the above structure, a conductive layer may be provided below the oxide semiconductor layer.

In the above structure, a channel length L of the transistor, which is determined by the distance between the source electrode and the drain electrode, can be greater than or equal to 10 nm and less than or equal to 10 μm, preferably 0.1 μm to 0.5 μm. The channel length L may be 10 μm or more. A channel width W can be greater than or equal to 10 μm.

According to an embodiment of the present invention, oxygen-excess silicon oxide ($SiO_X$ (X>2)) is used for a base insulating layer of a top-gate structure or for a protective insulating layer of a bottom-gate structure, instability of electrical characteristics between before and after light irradiation or a BT test can be improved. Accordingly, a transistor having stable electric characteristics is provided.

BEST MODE FOR CARRYING OUT THE INVENTION

Figure 1A:
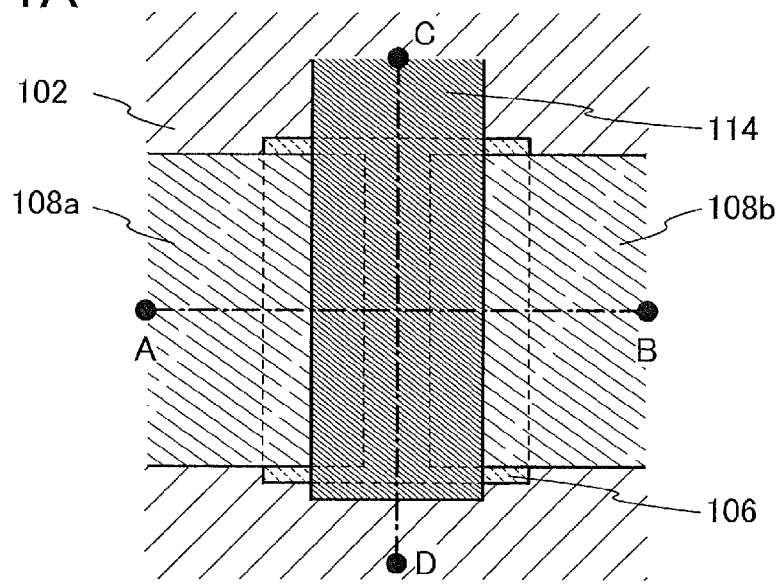
FIGS. 1A to 1C are a plan view and cross-sectional views, illustrating an example of a semiconductor device that is an embodiment of the present invention.

Hereinafter, embodiments of the present invention will be described in detail with reference to the accompanying drawings. However, the present invention is not limited to the description below and it is easily understood by those skilled in the art that the mode and details can be changed variously. Therefore, the present invention is not construed as being limited to description of the embodiments. In describing structures of the present invention with reference to the drawings, the same reference numerals are used in common for the same portions in different drawings. Note that the same hatch pattern is applied to similar parts, and the similar parts are not especially denoted by reference numerals in some cases.

Note that the ordinal numbers such as "first" and "second" in this specification are used for convenience and do not denote the order of steps or the stacking order of layers. In addition, the ordinal numbers in this specification do not denote particular names which specify the present invention.

Embodiment 1

In this embodiment, modes of a semiconductor device and a method for manufacturing the semiconductor device will be described with reference to FIGS. 1A to 1C, FIGS. 2A to 2D, FIGS. 3A to 3E, FIGS. 4A to 4E, FIGS. 5A to 5E, FIGS. 6A to 6E, and FIGS. 7A to 7E.

Figure 1B:
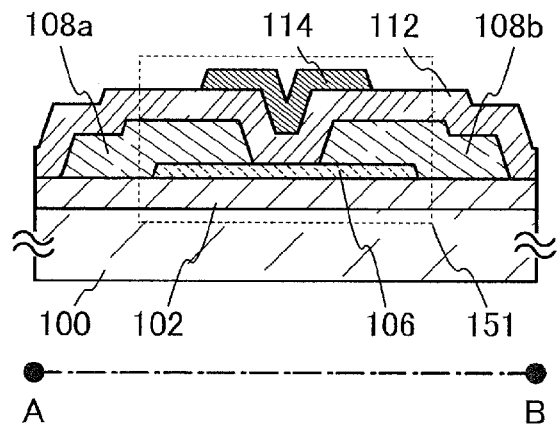
Figure 1C:
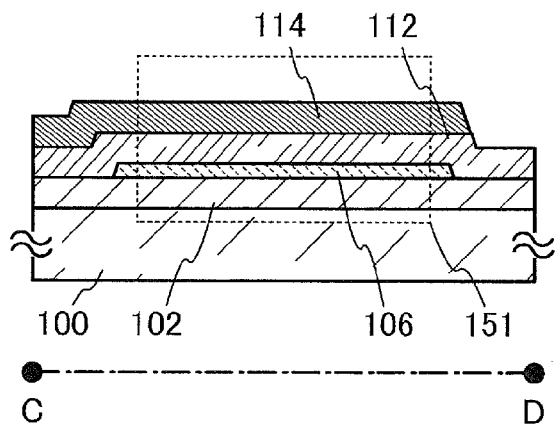

FIGS. 1A to 1C are a plan view and cross-sectional views, illustrating a transistor 151 which is a top-gate top-contact type transistor as an example of a semiconductor device of an embodiment of the present invention. Here, FIG. 1A is a plan view, FIG. 1B is a cross-sectional view along A-B of FIG. 1A, and FIG. 1C is a cross-sectional view along C-D of FIG. 1A. Note that some components of the transistor 151 (e.g., a gate insulating layer 112) are omitted in FIG. 1A for brevity.

The transistor 151 illustrated in FIGS. 1A to 1C includes, over a substrate 100, a base insulating layer 102, an oxide semiconductor layer 106, a source electrode 108a, a drain electrode 108b, the gate insulating layer 112, and a gate electrode 114.

As a material of the base insulating layer 102, oxygen-excess silicon oxide ($SiO_X$ (X>2)) may be used. In the oxygen-excess silicon oxide ($SiO_X$ (X>2)), the number of oxygen atoms per unit volume is more than twice the number of silicon atoms per unit volume. The number of silicon atoms and the number of oxygen atoms per unit volume are measured by Rutherford backscattering spectrometry. The base insulating layer 102 may be formed by stacking layers using materials selected from silicon nitride, silicon nitride oxide, aluminum oxide, aluminum nitride, a mixed material of these, and the like. For example, a layered structure of a silicon nitride layer and a silicon oxide layer is used for the base insulating layer 102, thereby preventing moisture from entering the transistor 151 from the substrate or the like. In the case where the base insulating layer 102 is formed with a layered structure, a layer in a side in contact with the oxide semiconductor layer 106 is preferably an oxide layer such as a silicon oxide layer. Note that the base insulating layer 102 functions as a base layer of the transistor 151. By using the oxygen-excess silicon oxide ($SiO_X$ (X>2)) for the base insulating layer 102, an excess of oxygen over the stoichiometric proportion reduces the interface state density and the oxygen deficiency of the oxide semiconductor layer 106, and influence of trapping of charge at an interface between the oxide semiconductor layer 106 and the base insulating layer 102 can be reduced.

Here, silicon nitride oxide means a substance in which the nitrogen content is higher than the oxygen content, e.g., a substance containing oxygen, nitrogen, silicon, and hydrogen at concentrations ranging from 5 atomic % to 30 atomic %, 20 atomic % to 55 atomic %, 25 atomic % to 35 atomic %, and 10 atomic % to 25 atomic %, respectively. Note that in this specification, silicon oxynitride is a substance that contains more oxygen than nitrogen. For example, silicon oxynitride includes oxygen in the range of greater than or equal to 50 atomic % and less than or equal to 70 atomic %, nitrogen in the range of greater than or equal to 0.5 atomic % and less than or equal to 15 atomic %, silicon in the range of greater than or equal to 25 atomic % and less than or equal to 35 atomic %, and hydrogen in the range of greater than or equal to 0.1 atomic % and less than or equal to 10 atomic %. Note that the above ranges are the values obtained by employing Rutherford backscattering spectrometry (RBS) or hydrogen forward scattering spectrometry (HFS). In addition, the total of the percentages of the constituent elements does not exceed 100 atomic %.

As a material used for the oxide semiconductor layer, the oxide semiconductor includes at least one element selected from In, Ga, Sn, Zn, Al, Mg, Hf and lanthanoid. For example, a four-component metal oxide material such as an In—Sn—Ga—Zn—O-based material; a three-component metal oxide material such as an In—Ga—Zn—O-based material, an In—Sn—Zn—O-based material, an In—Al—Zn—O-based material, a Sn—Ga—Zn—O-based material, an Al—Ga—Zn—O-based material, a Sn—Al—Zn—O-based material, In—Hf—Zn—O-based material, In—La—Zn—O-based material, In—Ce—Zn—O-based material, In—Pr—Zn—O-based material, In—Nb—Zn—O-based material, In—Pm—Zn—O-based material, In—Sm—Zn—O-based material, In—Eu—Zn—O-based material, In—Gd—Zn—O-based material, In—Er—Zn—O-based material, In—Tm—Zn—O-based material, In—Yb—Zn—O-based material, or In—Lu—Zn—O-based material; a two-component metal oxide material such as an In—Zn—O-based material, a Sn—Zn—O-based material, an Al—Zn—O-based material, a Zn—Mg—O-based material, a Sn—Mg—O-based material, an In—Mg—O-based material, or an In—Ga—O-based material; or a one-component metal oxide material such as an In—O-based material, a Sn—O-based material, or a Zn—O-based material can be used. In addition, the above materials may contain $SiO_2$. Here, for example, an In—Ga—Zn—O-based material means an oxide layer containing indium (In), gallium (Ga), and zinc (Zn), and there is no particular limitation on the composition ratio thereof. Further, the In—Ga—Zn—O-based oxide semiconductor may contain an element other than In, Ga, and Zn. For example, in the case of using an In—Zn—O-based material, an atomic ratio thereof is as follows: In:Zn=0.5:1 to 50:1, preferably In:Zn=1:1 to 20:1, further preferably In:Zn=3:2 to 30:2. The atomic ratio of Zn is within the above range, whereby the field effect mobility of the transistor can be improved. Here, when the atomic ratio of the compound is that In:Zn:O=X:Y:Z, it is preferable that Z>1.5X+Y.

The oxide semiconductor layer may be formed with a thin film formed using a material represented by the chemical formula, $InMO_3(ZnO)_m$ (m>0). Here, M represents one or more metal elements selected from Ga, Al, Mn, and Co. For example, M may be Ga, Ga and Al, Ga and Mn, Ga and Co, or the like.

The oxide semiconductor layer is preferably formed using a material with a band gap greater than or equal to 3 eV, preferably a material with a band gap greater than or equal to 3 eV and less than 3.6 eV. In addition, the electron affinity of the material is preferably greater than or equal to 4 eV, further preferably greater than or equal to 4 eV and less than 4.9 eV. Among such materials, a material whose carrier concentration derived from a donor or an acceptor is less than $1 \times 10^{14}$ $cm^{-3}$, preferably less than $1 \times 10^{11}$ $cm^{-3}$ is desirable. In addition, the hydrogen concentration of the oxide semiconductor layer is preferably less than $1 \times 10^{18}$ $cm^{-3}$, further preferably less than $1 \times 10^{16}$ $cm^{-3}$. The above-described oxide semiconductor layer is made to be i-type (intrinsic) by high purification. A thin film transistor whose active layer is formed using the above-described oxide semiconductor layer can have an extremely low off-state current of 1 zA (zeptoampere, $10^{-21}$ A) (extremely high values of $10^{20} \Omega$ to $10^{21} \Omega$ when being converted into resistance).

When the oxide semiconductor layer and the base insulating layer are in contact with each other, the interface state density between the base insulating layer 102 and the oxide semiconductor layer 106 and oxygen deficiency in the oxide semiconductor layer 106 can be reduced. By reduction of the interface state density, change in the threshold voltage after a BT test can be small.

A material having a high dielectric constant, such as hafnium oxide or aluminum oxide, may be used for the gate insulating layer 112 considering the function of the gate insulating layer of the transistor. In addition, considering a gate withstand voltage or the interface state with the oxide semiconductor, a material having a high dielectric constant, such as hafnium oxide or aluminum oxide, may be stacked on silicon oxide, silicon oxynitride, or silicon nitride. In the case of using silicon oxide, the same structure as the structure of the base insulating layer 102 is preferably employed. An excess of oxygen over the stoichiometric proportion reduces the interface state density and oxygen deficiency of the oxide semiconductor layer 106, and influence of trapping of charge at an interface between the oxide semiconductor layer 106 and the gate insulating layer 112 can be reduced.

Further, a protective insulating layer may be provided over the transistor 151. The protective insulating layer can have the same structure as the base insulating layer 102. In addition, in order that the source electrode 108a or the drain electrode 108b is electrically connected to a wiring, an opening portion may be formed in the base insulating layer 102, the gate insulating layer 112, or the like. A second gate electrode may further be provided below the oxide semiconductor layer 106. Note that the oxide semiconductor layer 106 is preferably processed into an island shape but is not necessarily processed into the shape.

FIGS. 2A to 2D illustrate cross-sectional structures of transistors having different structures from the transistor 151.

Figure 2A:
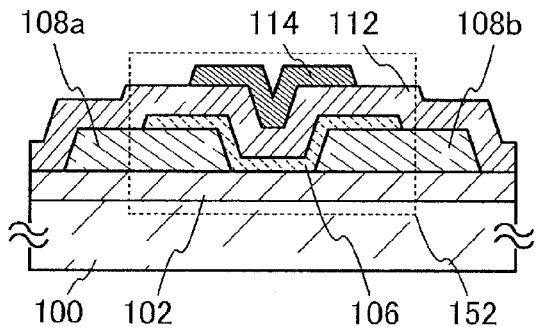
FIGS. 2A to 2D are cross-sectional views each illustrating an example of a semiconductor device that is an embodiment of the present invention.

A transistor 152 illustrated in FIG. 2A is the same as the transistor 151 in that the base insulating layer 102, the oxide semiconductor layer 106, the source electrode 108a, the drain electrode 108b, the gate insulating layer 112, and the gate electrode 114 are included. The differences between the transistor 152 and the transistor 151 are the positions where the oxide semiconductor layer 106 is connected to the source electrode 108a and the drain electrode 108b. In other words, in the transistor 152, a lower part of the oxide semiconductor layer 106 is in contact with the source electrode 108a and the drain electrode 108b. The other components are similar to those of the transistor 151 in FIGS. 1A to 1C.

Figure 2B:
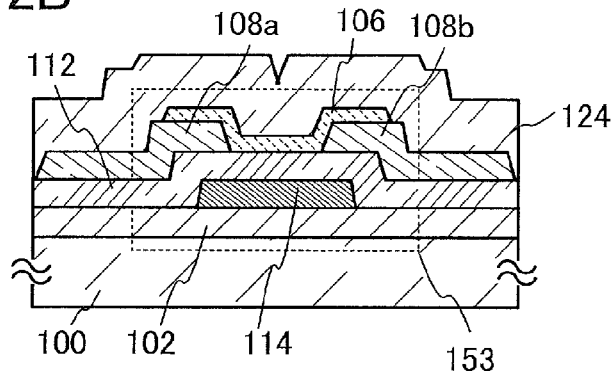

A transistor 153 illustrated in FIG. 2B is the same as the transistor 152 in that the base insulating layer 102, the oxide semiconductor layer 106, the source electrode 108a, the drain electrode 108b, the gate insulating layer 112, and the gate electrode 114 are included. The difference between the transistor 153 and the transistor 152 is the position of the gate electrode with respect to the oxide semiconductor layer 106. In other words, in the transistor 153, the gate electrode is provided below the oxide semiconductor layer 106 with the gate insulating layer 112 provided therebetween. In addition, in the transistor 153, a protective insulating layer 124 is provided to cover the source electrode 108a, the drain electrode 108b, and the oxide semiconductor layer 106. The other components are similar to those of the transistor 152 in FIG. 2A. In the transistor 153, the protective insulating layer 124 in contact with the oxide semiconductor layer 106 can have the same structure as the base insulating layer 102 of the transistor 151 and is formed using oxygen-excess silicon oxide (SiO$_X$(X>2)).

Figure 2C:
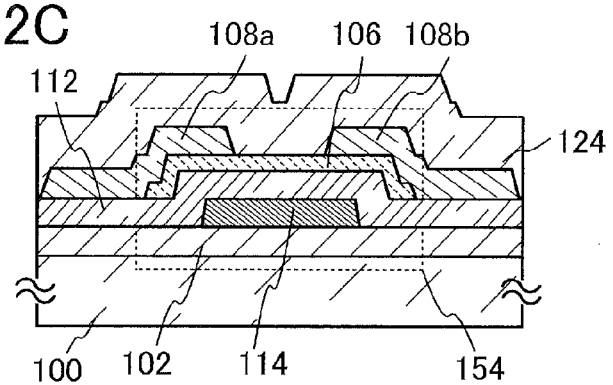

A transistor 154 illustrated in FIG. 2C is the same as the transistor 151 in that the base insulating layer 102, the oxide semiconductor layer 106, the source electrode 108a, the drain electrode 108b, the gate insulating layer 112, and the gate electrode 114 are included. The difference between the transistor 154 and the transistor 151 is the position of the gate electrode with respect to the oxide semiconductor layer 106. In other words, in the transistor 154, the gate electrode is provided below the oxide semiconductor layer 106 with the gate insulating layer 112 provided therebetween. In addition, in the transistor 154, the protective insulating layer 124 is provided to cover the source electrode 108a, the drain electrode 108b, and the oxide semiconductor layer 106. The other components are similar to those of the transistor 151 in FIGS. 1A to 1C. In the transistor 154, the protective insulating layer 124 in contact with the oxide semiconductor layer 106 can have the same structure as the base insulating layer 102 of the transistor 151 and is formed using oxygen-excess silicon oxide (SiO$_X$(X>2)).

Figure 2D:
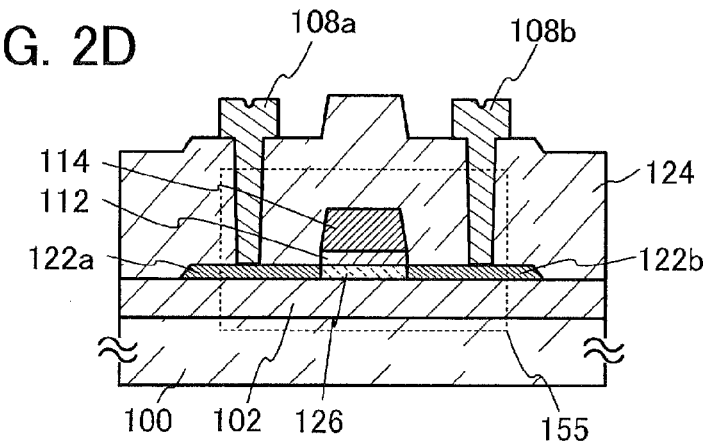

A transistor 155 illustrated in FIG. 2D is the same as the transistor 151 and the transistor 152 in that the base insulating layer 102, the gate insulating layer 112, and the gate electrode 114, the source electrode 108a, and the drain electrode 108b are included. The transistor 155 is different from the transistor 151 and the transistor 152 in that a channel region 126, a source region 122a, and a drain region 122b are formed over one flat surface in an oxide semiconductor layer. The source electrode 108a and the drain electrode 108b are connected to the source region 122a and the drain region 122b respectively, through the protective insulating layer 124. Note that although the gate insulating layer 112 is provided only below the gate electrode 114 in FIG. 2D, this embodiment is not limited thereto. For example, the gate insulating layer 112 may be provided so as to cover the oxide semiconductor layer including the channel region 126, the source region 122a, and the drain region 122b.

The base insulating layer 102 can have the same structure as the base insulating layer 102 of the transistor 151.

Examples of manufacturing processes of transistors illustrated in FIGS. 1A to 1C will be described below with reference to FIGS. 3A to 3E and FIGS. 4A to 4E.

First, an example of a manufacturing process of the transistor 151 illustrated in FIGS. 1A to 1C is described with reference to FIGS. 3A to 3E.

Figure 3A:
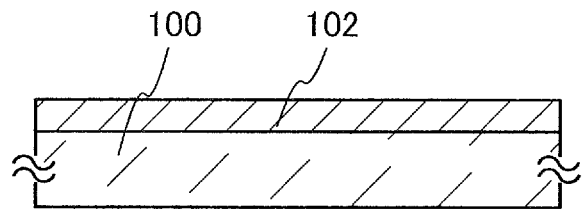
FIGS. 3A to 3E are cross-sectional views illustrating an example of a manufacturing process of a semiconductor device that is an embodiment of the present invention.

The base insulating layer 102 is formed over the substrate 100 (see FIG. 3A). A feature of this embodiment is the use of oxygen-excess silicon oxide (SiO$_X$(X>2)) for the base insulating layer 102.

Although there is no particular limitation on a material and the like of the substrate 100, it is necessary that the substrate have heat resistance high enough to withstand at least heat treatment performed later. For example, a glass substrate, a ceramic substrate, a quartz substrate, or a sapphire substrate can be used as the substrate 100. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 100. Still alternatively, any of these substrates further provided with a semiconductor element may be used as the substrate 100.

A flexible substrate may alternatively be used as the substrate 100. In that case, the transistor is manufactured over the flexible substrate directly. Note that as a method for providing the transistor over the flexible substrate, there is also a method in which a non-flexible substrate is used as the substrate 100, the transistor is formed thereover, and then the transistor is separated and transferred to a flexible substrate. In that case, a separation layer is preferably provided between the substrate 100 and the transistor.

As a formation method for the base insulating layer 102, for example, a plasma CVD method, a sputtering method, or the like can be used. It is preferable to use a sputtering method. Oxygen-excess silicon oxide (SiO$_X$ (X>2)) is used for the base insulating layer 102. Alternatively, the base insulating layer 102 may be formed by stacking layers using materials selected from silicon nitride, silicon nitride oxide, aluminum oxide, aluminum nitride, a mixed material thereof, and the like. In the case where the base insulating layer 102 is formed with a layered structure, a layer in a side in contact with the oxide semiconductor layer 106 is preferably formed using oxygen-excess silicon oxide (SiO$_X$ (X>2)). The total thickness of the base insulating layer 102 is preferably greater than 100 nm, further preferably greater than or equal to 300 nm. With the base insulating layer 102 having a large thickness, the amount of oxygen discharged from the base insulating layer 102 can be increased.

In the case where oxygen or a mixed gas of oxygen and a rare gas (such as helium, neon, argon, krypton, or xenon) is used as a deposition gas in the formation of the oxygen-excess silicon oxide (SiO$_X$ (X>2)) with the use of a sputtering method, the ratio of oxygen in the a mixing ratio of oxygen and a rare gas is preferably increased. For example, the oxygen concentration in the whole gas may be greater than or equal to 20% and less than or equal to 100%.

For example, the silicon oxide is formed by an RF sputtering method using a quartz (preferably synthetic quartz) target under the following conditions: the substrate temperature is higher than or equal to 30° C. and lower than or equal to 450° C. (preferably higher than or equal to 70° C. and lower than or equal to 200° C.); the distance between the substrate and the target (the T-S distance) is greater than or equal to 20 mm and less than or equal to 400 mm (preferably greater than or equal to 40 mm and less than or equal to 200 mm); the pressure is greater than or equal to 0.1 Pa and less than or equal to 4 Pa (preferably greater than or equal to 0.2 Pa and less than or equal to 1.2 Pa); the high-frequency power source is greater than or equal to 0.5 kW and less than or equal to 12 kW (preferably greater than or equal to 1 kW and less than or equal to 5 kW); and the ratio of $O_2/(O_2+Ar)$ in the deposition gas is greater than 20% and less than or equal to 100% (preferably greater than or equal to 50% and less than or equal to 100%). Note that a silicon target may be used as the target instead of the quartz (preferably synthetic quartz) target. Note that an oxygen gas or a mixed gas of oxygen and argon is used as a deposition gas.

Figure 3B:
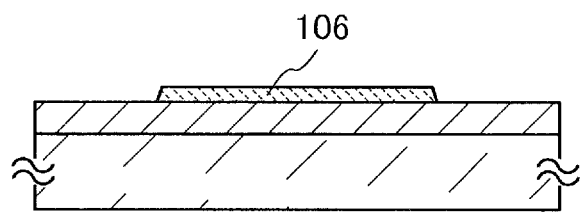

Next, an oxide semiconductor layer is formed over the base insulating layer 102 and then is processed to form the oxide semiconductor layer 106 having an island shape (see FIG. 3B).

The oxide semiconductor layer can be formed using a sputtering method, a vacuum evaporation method, a pulse laser deposition method, a CVD method, or the like, for example. The thickness of the oxide semiconductor layer is preferably greater than or equal to 3 nm and less than or equal to 50 nm. If the oxide semiconductor layer is too thick (e.g., a thickness of 100 nm or more), the influence of a short-channel effect is increased, and there is a possibility that a transistor with a small size is normally on. Here, the "normally on" refers to a state in which a channel exists even when a voltage is not applied to the gate electrode and current flows in the transistor. Note that the base insulating layer 102 and the oxide semiconductor layer are preferably deposited successively without exposure to the air.

For example, the oxide semiconductor layer is formed by a sputtering method using an In—Ga—Zn—O-based oxide target.

As the In—Ga—Zn—O-based oxide target, for example, an oxide target having a composition ratio of $In_2O_3:Ga_2O_3:ZnO=1:1:1$ [molar ratio] can be used. Note that it is not necessary to limit the material and the composition ratio of the target to the above. For example, an oxide target having a composition ratio of $In_2O_3:Ga_2O_3:ZnO=1:1:2$ [molar ratio] can be used alternatively.

The relative density of the oxide target is greater than or equal to 90% and less than or equal to 100%, preferably, greater than or equal to 95% and less than or equal to 99.9%. By using the metal oxide target with high relative density, a dense oxide semiconductor layer can be formed.

The deposition may be performed in a rare gas atmosphere, an oxygen atmosphere, a mixed gas atmosphere of a rare gas and oxygen, or the like. Moreover, it is preferable to use an atmosphere using a high-purity gas from which impurities such as hydrogen, water, a hydroxyl group, and hydride are sufficiently removed in order to prevent entry of hydrogen, water, a hydroxyl group, and hydride into the oxide semiconductor layer.

Treatment with plasma including oxygen may be performed on the oxide semiconductor layer. By performing treatment on the oxide semiconductor layer with plasma including oxygen, the oxygen can be contained either or both in the oxide semiconductor layer or/and in the vicinity of the interface of the oxide semiconductor film. In that case, the amount of oxygen contained in the oxide semiconductor layer is greater than the stoichiometric proportion of the oxide semiconductor layer, preferably greater than the stoichiometric proportion and less than twice the stoichiometric proportion. Alternatively, the amount of oxygen may be greater than Y, preferably greater than Y and less than 2Y, where the amount of oxygen in the case where the material of the oxide semiconductor layer is a single crystal is Y. Still alternatively, the amount of oxygen may be greater than Z, preferably greater than Z and less than 2Z based on the amount of oxygen Z in the insulating film in the case where oxygen doping is not performed. The reason of the presence of the upper limit in the above preferable range is that the oxide semiconductor layer might take hydrogen like a hydrogen storing alloy (hydrogen storage alloy) when the amount of oxygen is too large. Note that in the oxide semiconductor layer, the amount of oxygen is larger than the amount of hydrogen.

For example, the oxide semiconductor layer can be formed as follows.

An example of the deposition conditions is as follows: the distance between the substrate and the target is 60 mm, the pressure is 0.4 Pa, the direct-current (DC) power is 0.5 kW, and the deposition atmosphere is a mixed atmosphere of argon and oxygen (the flow rate of the oxygen is 33%). Note that a pulse direct current (DC) sputtering method is preferably used because powder substances (also referred to as particles or dust) generated in deposition can be reduced and the film thickness can be uniform.

First, the substrate 100 is placed in a deposition chamber kept under reduced pressure, and the substrate temperature is set to a temperature higher than or equal to 100° C. and lower than or equal to 600° C., preferably higher than or equal to 200° C. and lower than or equal to 400° C. This is because the concentration of excessive hydrogen (including water or a hydroxyl group or another impurity contained in the oxide semiconductor film can be reduced when deposition is performed while the substrate 100 is heated. Moreover, damage due to sputtering can be reduced. Oxygen is discharged from the base insulating layer 102, and oxygen deficiency in the oxide semiconductor layer and the interface state density between the base insulating layer 102 and the oxide semiconductor layer can be reduced.

Note that before the oxide semiconductor layer 106 is formed by a sputtering method, reverse sputtering in which plasma is generated with a rare gas introduced may be performed so that a material attached to a surface where the oxide semiconductor layer is to be formed (e.g., a surface of the base insulating layer 102) may be removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface to be processed in an argon atmosphere so that plasma is generated in the vicinity of the object to be processed. Note that an atmosphere of nitrogen, helium, oxygen, or the like may be used instead of an argon atmosphere.

The process for forming the oxide semiconductor layer 106 can be performed in such a manner that a mask having a desired shape is formed over the oxide semiconductor layer and then the oxide semiconductor layer is etched. The above-described mask can be formed by a method such as photolithography. Alternatively, a method such as an inkjet method may be used to form the mask.

Note that the etching of the oxide semiconductor layer may be dry etching or wet etching. It is needless to say that these may be combined.

After that, heat treatment (first heat treatment) may be performed on the oxide semiconductor layer. Through the first heat treatment, excessive hydrogen (including water or a hydroxyl group) in the oxide semiconductor layer can be removed, and the structure of the oxide semiconductor layer can be ordered. A temperature of the first heat treatment is higher than or equal to 100° C. and lower than or equal to 650° C. or lower than the strain point of the substrate, preferably higher than or equal to 250° C. and lower than or equal to 600° C. The heat treatment is performed in an oxidation gas atmosphere or an inert gas atmosphere.

Note that the inert gas atmosphere is an atmosphere which contains nitrogen or a rare gas (e.g., helium, neon, or argon) as its main component and preferably does not contain water, hydrogen, or the like. For example, the purity of nitrogen or a rare gas such as helium, neon, or argon introduced into a heat treatment apparatus is greater than or equal to 6N (99.9999%), preferably greater than or equal to 7N (99.99999%) (i.e., the impurity concentration is less than or equal to 1 ppm, preferably less than or equal to 0.1 ppm). The inert atmosphere refers to an atmosphere which contains an inert gas as its main component and contains a reactive gas at a proportion less than 10 ppm. The reactive gas refers to a gas which reacts with silicon, metal, and the like.

Note that the oxidation gas refers to oxygen, ozone, nitrous oxide, and the like and preferably does not contain water, hydrogen, and the like. For example, the purity of oxygen, ozone, nitrous oxide, or the like introduced into the heat treatment apparatus is greater than or equal to 6N (99.9999%), preferably greater than or equal to 7N (99.99999%) (i.e., the impurity concentration is less than or equal to 1 ppm, preferably less than or equal to 0.1 ppm). An oxidation gas mixed with an inert gas may be used for the oxidation gas atmosphere and includes an oxidation gas at least at a proportion greater than or equal to 10 ppm.

Through the first heat treatment, oxygen is discharged from the base insulating layer 102, the interface state density between the base insulating layer 102 and the oxide semiconductor layer 106 and the oxygen deficiency in the oxide semiconductor layer 106 can be reduced. By reduction of the interface state density, change in the threshold voltage after a BT test can be small. It is generally known that oxygen deficiency in an oxide semiconductor layer serves as a donor and causes an electron that is a carrier. When electrons are generated in the oxide semiconductor layer 106, the threshold voltage of the transistor 151 shifts in the negative direction and the transistor 151 tends to be normally on. The oxygen deficiency in the oxide semiconductor layer 106 is compensated, whereby the amount of shift of the threshold voltage in the negative direction can be reduced.

The heat treatment can be performed in such a manner that, for example, an object to be processed is introduced into an electric furnace in which a resistance heating element or the like is used and heated at 350° C. in a nitrogen atmosphere for one hour. During the heat treatment, the oxide semiconductor layer is not exposed to the air to prevent the entry of water and hydrogen.

The heat treatment apparatus is not limited to an electric furnace and the heat treatment apparatus can be an apparatus that heats an object to be processed by thermal conduction or thermal radiation given by a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object to be processed by heat treatment, for example, nitrogen or a rare gas such as argon is used.

For example, as the first heat treatment, a GRTA process may be performed as follows. The object to be processed is put in an inert gas atmosphere that has been heated, heated for several minutes, and taken out from the inert gas atmosphere. The GRTA process enables high-temperature heat treatment for a short time. Moreover, the GRTA process can be employed even when the temperature exceeds the upper temperature limit of the object to be processed. Note that the inert gas atmosphere may be changed during the process to an atmosphere including an oxidation gas. This is because by performing the first heat treatment in the atmosphere including an oxidation gas, the oxygen deficiency in the oxide semiconductor layer 106 can be compensated and defect levels in an energy gap due to the oxygen deficiency can be reduced.

The above-described heat treatment (first heat treatment) has an effect of removing excessive hydrogen (including water and a hydroxyl group) and the like and thus can be referred to as dehydration treatment, dehydrogenation treatment, or the like. The dehydration treatment or the dehydrogenation treatment can be performed, for example, after the oxide semiconductor layer is processed into an island shape. Such dehydration treatment or dehydrogenation treatment may be performed once or plural times.

Note that in this description, the oxide semiconductor layer 106 is processed into an island shape and then the first heat treatment is performed. However, an embodiment of the present invention is not limited thereto. After the first heat treatment is performed, the oxide semiconductor layer 106 may be processed.

Figure 3C:
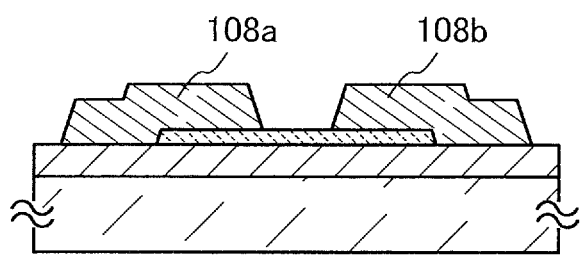

Next, a conductive layer for forming the source electrode and the drain electrode (including a wiring formed in the same layer as the source electrode and the drain electrode) is formed over the base insulating layer 102 and the oxide semiconductor layer 106, and the conductive layer is processed to form the source electrode 108a and the drain electrode 108b which are apart from each other (see FIG. 3C). A channel length L of the transistor is determined by the distance between edges of the source electrode 108a and the drain electrode 108b which are formed here.

As the conductive layer used for the source electrode 108a and the drain electrode 108b, for example, a metal layer containing an element selected from Al, Cr, Cu, Ta, Ti, Mo, and W; a metal nitride layer containing any of the above elements as its component (e.g., a titanium nitride layer, a molybdenum nitride layer, or a tungsten nitride layer); or the like can be used. Another structure may be used, in which a high-melting-point metal layer of Ti, Mo, W, or the like or a metal nitride layer of any of these elements (a titanium nitride layer, a molybdenum nitride layer, or a tungsten nitride layer) is stacked on one of or both a bottom side and a top side of a low-melting-point and low-resistance metal layer of Al, Cu, or the like.

Further, the conductive layer used for the source electrode 108a and the drain electrode 108b may be formed using conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$; abbreviated to ITO), indium oxide-zinc oxide alloy ($In_2O_3$—ZnO), or any of these metal oxide materials in which silicon or silicon oxide is contained can be used.

The conductive layer can be processed by etching with the use of a resist mask. Ultraviolet, a KrF laser light, an ArF laser light, or the like is preferably used for light exposure for forming a resist mask for the etching.

In order that the channel length L is less than 25 nm, the light exposure is preferably performed at the time of forming the resist mask using, for example, extreme ultraviolet having an extremely short wavelength of several nanometers to several tens of nanometers. In the light exposure by extreme ultraviolet light, the resolution is high and the focus depth is large. Thus, the channel length L of the transistor formed later can be shortened, whereby the operation speed of a circuit can be increased.

The etching may be performed with the use of a resist mask formed using a so-called multi-tone mask. A resist mask formed using a multi-tone mask has a plurality of thicknesses and can be further changed in shape by ashing; thus, such a resist mask can be used in a plurality of etching steps for different patterns. Therefore, a resist mask corresponding to at least two kinds of different patterns can be formed by using one multi-tone mask. In other words, simplification of the steps can be realized.

Note that in the etching of the conductive layer, part of the oxide semiconductor layer 106 is etched, so that the oxide semiconductor layer having a groove (a recessed portion) is formed in some cases.

After that, plasma treatment may be performed using a gas such as oxygen, ozone, nitrous oxide so that an exposed surface of the oxide semiconductor layer 106 is oxidized and oxygen deficiency is compensated. In the case where the plasma treatment is performed, the gate insulating layer 112 in contact with part of the oxide semiconductor layer 106 is preferably formed following the plasma treatment without exposure to the air.

Figure 3D:
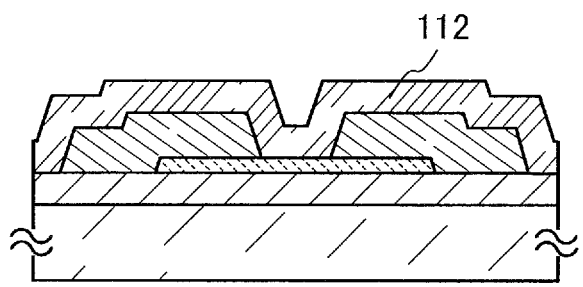

Then, the gate insulating layer 112 is formed to cover the source electrode 108a and the drain electrode 108b and be in contact with part of the oxide semiconductor layer 106 (see FIG. 3D).

Note that a material having a high dielectric constant, such as hafnium oxide or aluminum oxide, may be used for the gate insulating layer 112 considering the function of the gate insulating layer of the transistor. Alternatively, a material having a high dielectric constant, such as hafnium oxide or aluminum oxide, may be stacked on silicon oxide, silicon oxynitride, or silicon nitride, considering the gate withstand voltage and the interface state with the oxide semiconductor. The total thickness of the gate insulating layer 112 is preferably greater than or equal to 1 nm and less than or equal to 300 nm, further preferably greater than or equal to 5 nm and less than or equal to 50 nm. As the thickness of the gate insulating layer is larger, a short channel effect is enhanced more and the threshold voltage tends to shift more in the negative side. On the other hand, it is known that leakage due to tunnel current is increased when the thickness of the gate insulating layer is less than 5 nm. When the thickness of the gate insulating layer is greater than or equal to 5 nm and less than or equal to 50 nm, change of the threshold voltage after a BT test can be reduced. In the case of using silicon oxide for the gate insulating layer, the same structure as the base insulating layer 102 is preferably used.

After the gate insulating layer 112 is formed, second heat treatment may be performed. A temperature of the second heat treatment is higher than or equal to 250° C. and lower than or equal to 700° C., preferably higher than or equal to 350° C. and lower than or equal to 600° C. or lower than the strain point of the substrate.

The second heat treatment may be performed in an oxidation gas atmosphere or an inert gas atmosphere, and the atmosphere preferably does not contain water, hydrogen, and the like. It is also preferable that the purity of a gas introduced into a heat treatment apparatus be set to greater than or equal to 6N (99.9999%), preferably greater than or equal to 7N (99.99999%) (that is, the impurity concentration is less than or equal to 1 ppm, preferably less than or equal to 0.1 ppm).

The second heat treatment can reduce defects in the gate insulating layer 112.

Note that there is no particular limitation on the timing of the second heat treatment as long as it is performed after the gate insulating layer 112 is formed. For example, the second heat treatment may be performed after the gate electrode 114 is formed.

Figure 3E:
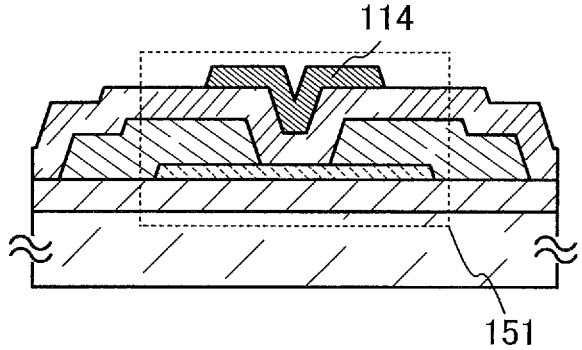

Then, the gate electrode 114 is formed (see FIG. 3E). The gate electrode 114 can be formed using a metal material such as molybdenum, titanium, tantalum, tungsten, aluminum, copper, neodymium, or scandium; a nitride of any of these material; or an alloy material containing any of these materials as a main component. Note that the gate electrode 114 may be formed with a single-layer structure or a layered structure.

Through the above-described process, the transistor 151 is formed.

Next, an example of a manufacturing process of the transistor 152 in FIG. 2A will be described with reference to FIGS. 4A to 4E. Note that as for layers and electrodes denoted by the same reference numerals as those of the transistor 151, the formation method of the transistor 151 can be referred to unless stated otherwise.

Figure 4A:
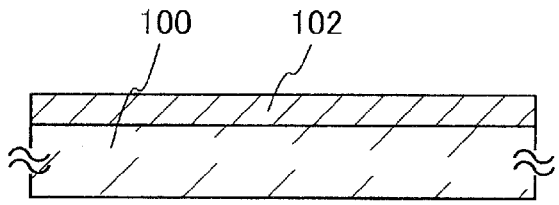
FIGS. 4A to 4E are cross-sectional views illustrating an example of a manufacturing process of a semiconductor device that is an embodiment of the present invention.

First, the base insulating layer 102 is formed over the substrate 100 (see FIG. 4A). The base insulating layer 102 is formed using oxygen-excess silicon oxide ($SiO_X$ (X>2)).

Figure 4B:
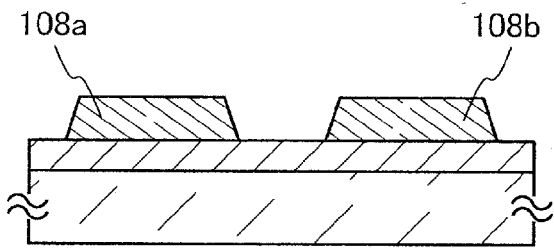

Next, a conductive layer for forming a source electrode and a drain electrode (including a wiring formed in the same layer as the source electrode and the drain electrode) is formed over the base insulating layer 102, and the conductive layer is processed to form the source electrode 108a and the drain electrode 108b which are apart from each other (see FIG. 4B).

Figure 4C:
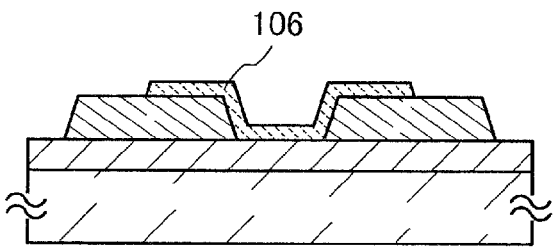

Then, an oxide semiconductor layer is formed over the base insulating layer 102 to be in contact with the source electrode 108a and the drain electrode 108b and is processed to form the oxide semiconductor layer 106 having an island shape is formed (see FIG. 4C). After that, first heat treatment may be performed similarly to the transistor 151.

Figure 4D:
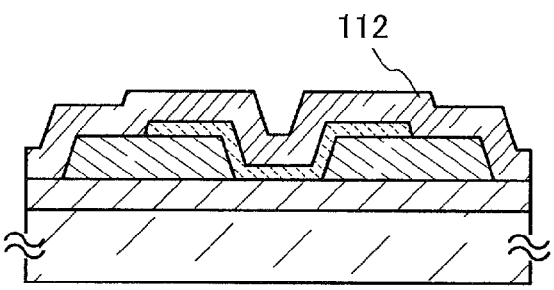

Next, the gate insulating layer 112 is formed to cover the source electrode 108a and the drain electrode 108b and be in contact with part of the oxide semiconductor layer 106 (see FIG. 4D). After that, the second heat treatment may be performed similarly to the transistor 151.

Figure 4E:
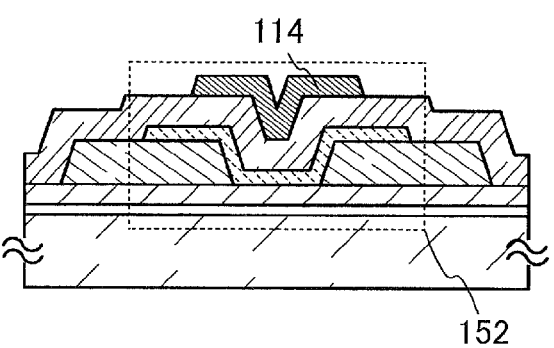

Then, the gate electrode 114 is formed (see FIG. 4E).

Through the above-described process, the transistor 152 is formed.

Note that when charge is trapped at the interface of the oxide semiconductor layer, the threshold voltage of the transistor shifts. For example, when positive charge is trapped on the back channel side, the threshold voltage of the transistor shifts in the negative direction. As a factor of such charge trapping, a model of transfer and trapping of cations (or atoms causing the cations) can be given. In this embodiment, oxygen-excess silicon oxide ($SiO_X$ (X>2)) is used for the base insulating layer, whereby the interface state density between the oxide semiconductor layer and the base insulating layer is reduced. Accordingly, in the above-described model, assumed charge trapping can be suppressed, and shift of the threshold voltage of the transistor can be suppressed.

Next, an example of a manufacturing process of the transistor 153 in FIG. 2B will be described with reference to FIGS. 5A to 5E. Note that as for layers and electrodes denoted by the same reference numerals as those of the transistor 151, the formation method of the transistor 151 can be referred to unless stated otherwise.

Figure 5A:
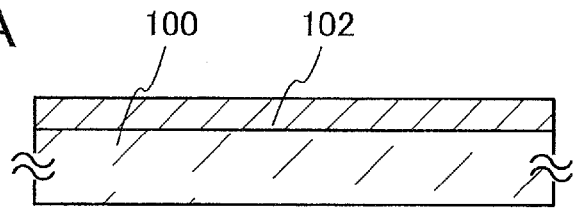
FIGS. 5A to 5E are cross-sectional views illustrating an example of a manufacturing process of a semiconductor device that is an embodiment of the present invention.

First, the base insulating layer 102 is formed over the substrate 100 (see FIG. 5A). Here, the base insulating layer 102 can be formed with a single layer or a stacked layer using one or more of silicon oxide, silicon oxynitride, silicon nitride oxide, silicon nitride, aluminum oxide, and the like.

Figure 5B:
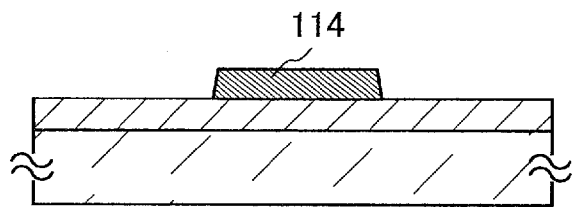

Next, the gate electrode 114 is formed over the base insulating layer 102 (see FIG. 5B).

Figure 5C:
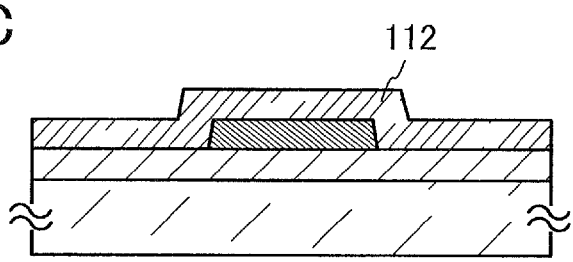
Figure 5D:
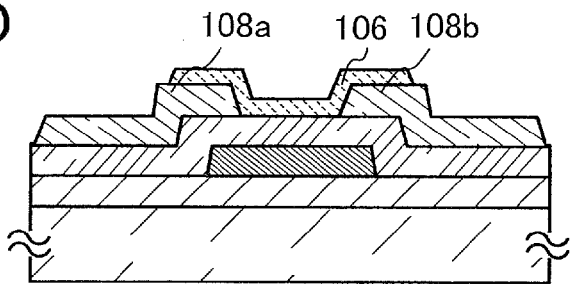

Then, the gate insulating layer 112 is formed over the gate electrode 114 (see FIG. 5C).

Next, the source electrode 108a and the drain electrode 108b are formed over the gate insulating layer 112. An oxide semiconductor layer is formed to be connected to the source electrode 108a and the drain electrode 108b, and the oxide semiconductor layer is processed to form the oxide semiconductor layer 106 having an island shape. After that, first heat treatment may be performed similarly to the transistor 151 (see FIG. 5D).

Figure 5E:
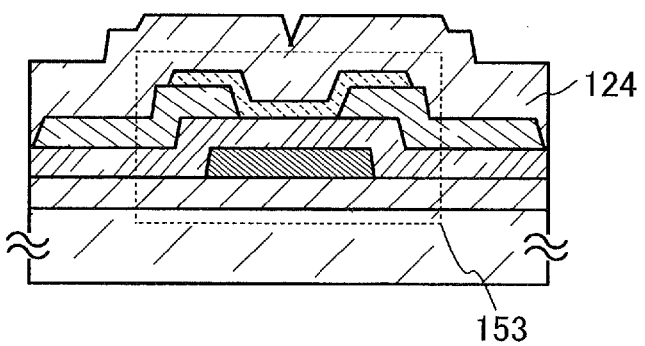

Next, the protective insulating layer 124 is formed to cover the oxide semiconductor layer 106, the source electrode 108a, and the drain electrode 108b (see FIG. 5E). For the protective insulating layer 124, (SiO$_X$ (X>2)) is used. After that, the second heat treatment may be performed similarly to the transistor 151.

Through the above-described process, the transistor 153 is formed.

Next, an example of a manufacturing process of the transistor 154 in FIG. 2C will be described with reference to FIGS. 6A to 6E. Note that as for layers and electrodes denoted by the same reference numerals as those of the transistor 151, the formation method of the transistor 151 can be referred to unless stated otherwise.

Figure 6A:
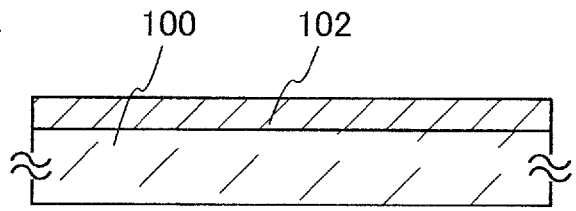
FIGS. 6A to 6E are cross-sectional views illustrating an example of a manufacturing process of a semiconductor device that is an embodiment of the present invention.

First, the base insulating layer 102 is formed over the substrate 100 (see FIG. 6A). Here, the base insulating layer 102 can be formed with a single layer or a stacked layer using one or more of silicon oxide, silicon oxynitride, silicon nitride oxide, silicon nitride, aluminum oxide, and the like.

Figure 6B:
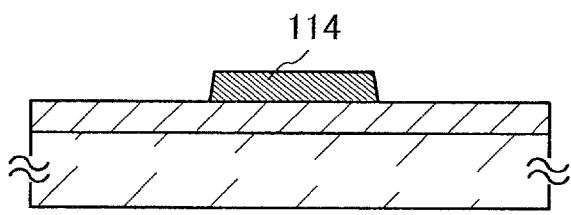

Next, the gate electrode 114 is formed over the base insulating layer 102 (see FIG. 6B).

Figure 6C:
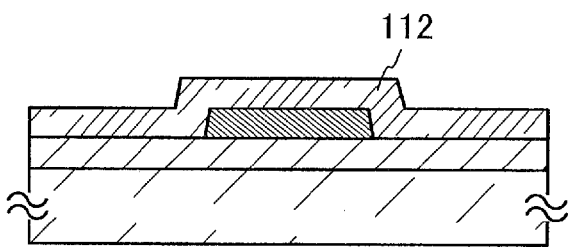
Figure 6D:
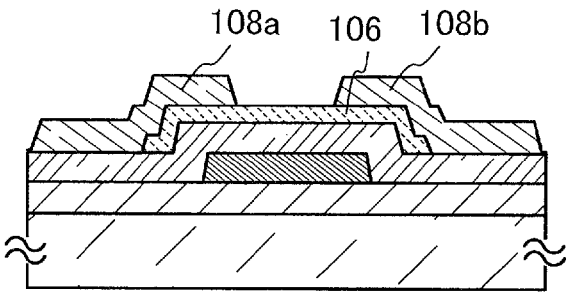

Then, the gate insulating layer 112 is formed over the gate electrode 114 (see FIG. 6C).

Next, an oxide semiconductor layer is formed over the gate insulating layer 112 and the oxide semiconductor layer is processed to form the oxide semiconductor layer 106 having an island shape. After that, first heat treatment may be performed similarly to the transistor 151. Then, the source electrode 108a and the drain electrode 108b are formed to be connected to the oxide semiconductor layer 106 (see FIG. 6D).

Figure 6E:
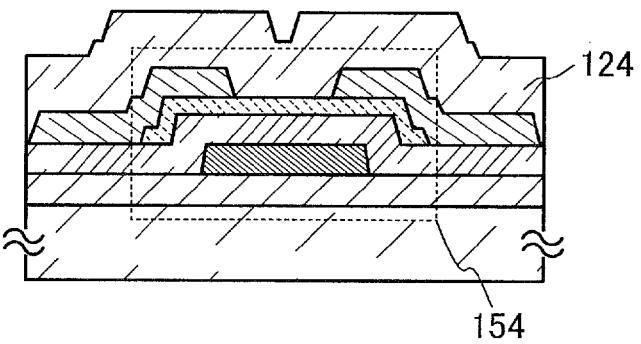

Next, the protective insulating layer 124 is formed to cover the oxide semiconductor layer 106, the source electrode 108a, and the drain electrode 108b (see FIG. 6E). For the protective insulating layer 124, (SiO$_X$ (X>2)) is used. After that, second heat treatment may be performed similarly to the transistor 151.

Through the above-described process, the transistor 154 is formed.

An example of a manufacturing process of the transistor 155 in FIG. 2D will be described with reference to FIGS. 7A to 7E. Note that as for layers and electrodes denoted by the same reference numerals as those of the transistor 151, the formation method of the transistor 151 can be referred to unless stated otherwise.

Figure 7A:
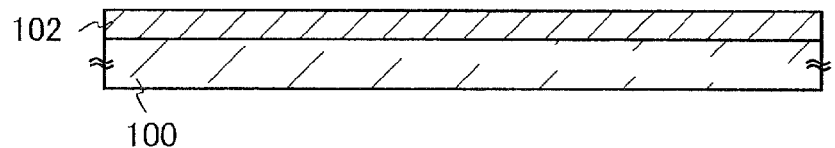
FIGS. 7A to 7E are cross-sectional views illustrating an example of a manufacturing process of a semiconductor device that is an embodiment of the present invention.

First, the base insulating layer 102 is formed over the substrate 100 (see FIG. 7A). For the base insulating layer 102, oxygen-excess silicon oxide (SiO$_X$ (X>2)) is used.

Figure 7B:
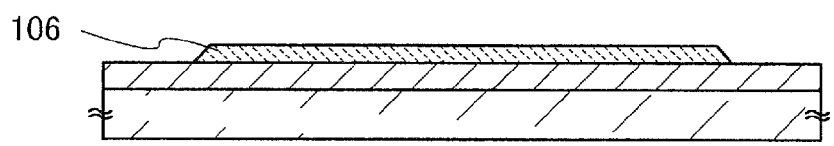

Next, an oxide semiconductor layer is formed over the base insulating layer 102 and the oxide semiconductor layer is processed to form the oxide semiconductor layer 106 having an island shape (see FIG. 7B). After that, first heat treatment may be performed similarly to the transistor 151

Figure 7C:
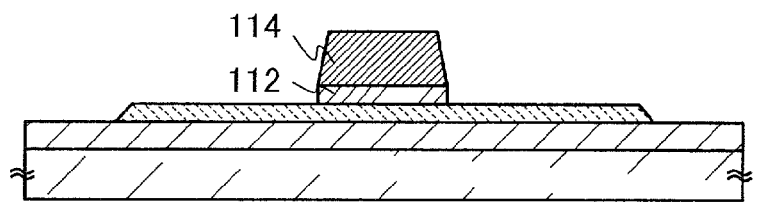
Figure 7D:
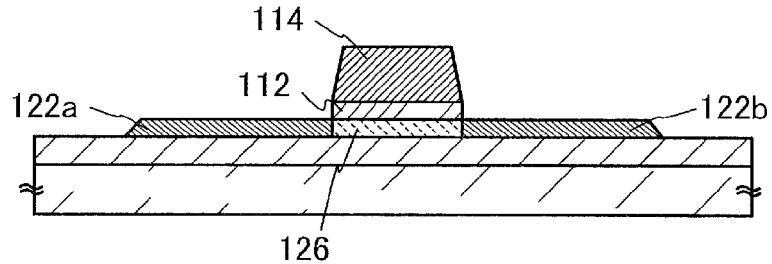
Figure 7E:
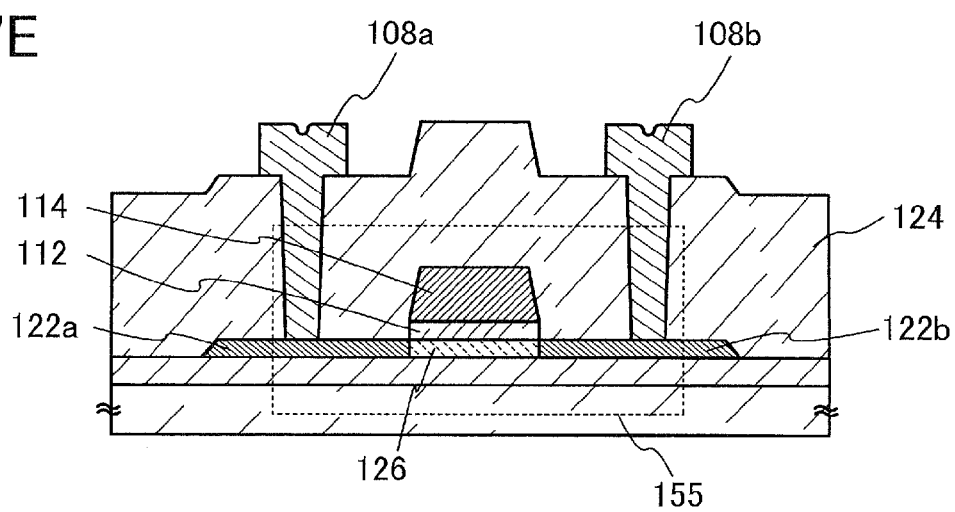

Next, the gate insulating layer 112 and the gate electrode 114 are formed and processed to have the same pattern by photolithography (see FIG. 7C). In this step, the gate electrode 114 may be processed and then the gate insulating layer 112 may be processed using the gate electrode 114 as a mask.

Next, the resistance of the oxide semiconductor layer 106 is reduced using the gate electrode 114 as a mask, so that the source region 122a and the drain region 122b are formed. A region below the gate electrode, whose resistance is not reduced, serves as the channel region 126 (see FIG. 7D). In that case, a channel length L of the transistor is determined by the width of the gate electrode. In this manner, by performing patterning using the gate electrode as a mask, an overlap of the gate electrode with the source or drain region is not formed and a parasitic capacitance is not generated in this region, so that the operation speed of the transistor can be increased.

Next, the protective insulating layer 124 is formed and opening portions are formed in regions of the protective insulating layer 124 overlapping with the source region 122a and the drain region 122b. Next, a conductive layer for forming the source electrode and the drain electrode (including a wiring formed in the same layer as the source electrode and the drain electrode) is formed and processed to form the source electrode 108a and the drain electrode 108b which are apart from each other (see FIG. 7E).

Through the above-described process, the transistor 155 is formed.

The oxide semiconductor layer used as an active layer of the transistor in this embodiment is highly purified to be an i-type (intrinsic) oxide semiconductor layer in the following manner: an impurity such as hydrogen (including water and hydroxyl group) is removed from an oxide semiconductor by heating the substrate at the step for forming the oxide semiconductor layer or performing heat treatment after the formation of the oxide semiconductor layer; and oxygen, which is a main component of the oxide semiconductor and is reduced at the same time as the step of removing the impurity, is supplied to the oxide semiconductor layer from the base insulating layer or the protective insulating layer formed using oxygen-excess silicon oxide (SiO$_X$ (X>2)). The transistor including the oxide semiconductor layer which is highly purified in the above manner has low off-state current and suppressed variation in the electrical characteristics and is electrically stable.

As described above, the semiconductor device including an oxide semiconductor having stable electric characteristics can be provided. Therefore, a semiconductor device with high reliability can be provided.

The methods and structures described in this embodiment can be combined as appropriate with any of the methods and structures described in the other embodiments.

Embodiment 2

A semiconductor device (also referred to as a display device) with a display function can be manufactured using the transistor an example of which is described in Embodiment 1. Moreover, part or the whole of circuitry which includes the transistor can be formed over a substrate where a pixel portion is formed, whereby a system-on-panel can be obtained.

Figure 8A:
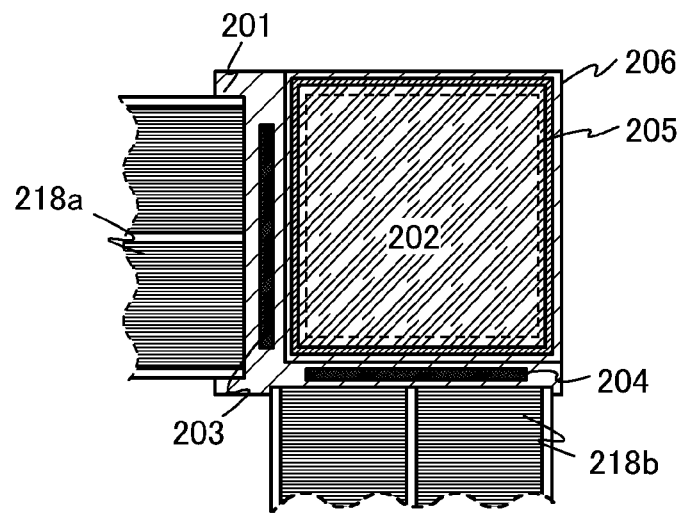
FIGS. 8A to 8C each illustrate one mode of a semiconductor device that is an embodiment of the present invention.

In FIG. 8A, a sealant 205 is provided so as to surround a pixel portion 202 provided over a first substrate 201, and the pixel portion 202 is sealed between the first substrate 201 and a second substrate 206. In FIG. 8A, a scan line driver circuit 204 and a signal line driver circuit 203 which are formed using a single crystal semiconductor layer or a polycrystalline semiconductor layer over a substrate separately prepared are mounted in a region that is different from the region surrounded by the sealant 205 over the first substrate 201. Further, various signals and potentials are supplied to the signal line driver circuit 203 and the scan line driver circuit 204 which are separately formed and to the pixel portion 202 from flexible printed circuits (FPCs) 218a and 218b.

Figure 8B:
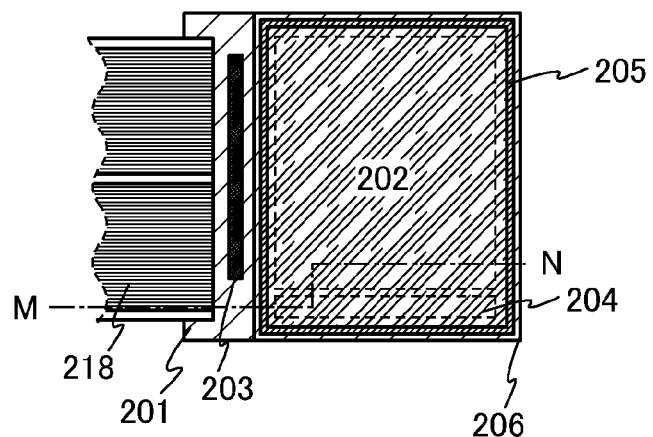
Figure 8C:
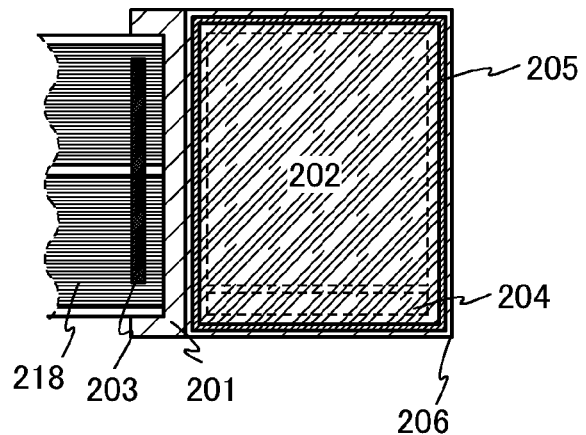

In FIGS. 8B and 8C, the sealant 205 is provided so as to surround the pixel portion 202 and the scan line driver circuit 204 which are provided over the first substrate 201. The second substrate 206 is provided over the pixel portion 202 and the scan line driver circuit 204. Consequently, the pixel portion 202 and the scan line driver circuit 204 are sealed together with a display element, by the first substrate 201, the sealant 205, and the second substrate 206. In FIGS. 8B and 8C, the signal line driver circuit 203, which is formed using a single crystal semiconductor layer or a polycrystalline semiconductor layer over a substrate prepared separately, is mounted in a region that is different from the region surrounded by the sealant 205 over the first substrate 201. In FIGS. 8B and 8C, various signals and potentials are supplied to the signal line driver circuit 203 which is separately formed, the scan line driver circuit 204, and the pixel portion 202 from a FPC 218.

Although FIGS. 8B and 8C each illustrate the example in which the signal line driver circuit 203 is formed separately and mounted on the first substrate 201, the present invention is not limited to this structure. The scan line driver circuit may be formed separately and then mounted, or only part of the signal line driver circuit or part of the scan line driver circuit may be formed separately and then mounted.

Note that a connection method of a separately formed driver circuit is not particularly limited, and a chip on glass (COG) method, a wire bonding method, a tape automated bonding (TAB) method or the like can be used. FIG. 8A illustrates an example in which the signal line driver circuit 203 and the scan line driver circuit 204 are mounted by a COG method. FIG. 8B illustrates an example in which the signal line driver circuit 203 is mounted by a COG method. FIG. 8C illustrates an example in which the signal line driver circuit 203 is mounted by a TAB method.

In addition, the display device includes a panel in which a display element is sealed, and a module in which an IC and the like including a controller are mounted on the panel.

Note that a display device in this specification means an image display device, a display device, or a light source (including a lighting device). The display device includes any of the following modules: a module provided with a connector such as an FPC, a TAB tape, or TCP; a module in which a printed wiring board is provided in the end of a TAB tape or TCP; and a module in which an integrated circuit (IC) is mounted directly on a display element by a COG method.

The pixel portion and the scan line driver circuit provided over the first substrate include a plurality of transistors and any of the transistors which are described in Embodiment 1 can be applied.

As the display element provided in the display device, a liquid crystal element (also referred to as a liquid crystal display element) or a light-emitting element (also referred to as a light-emitting display element) can be used. A light-emitting element includes, in its category, an element whose luminance is controlled by current or voltage, and specifically an inorganic electroluminescent (EL) element, an organic EL element, and the like. Furthermore, a display medium whose contrast is changed by an electric effect, such as electronic ink, can be used.

Figure 9:
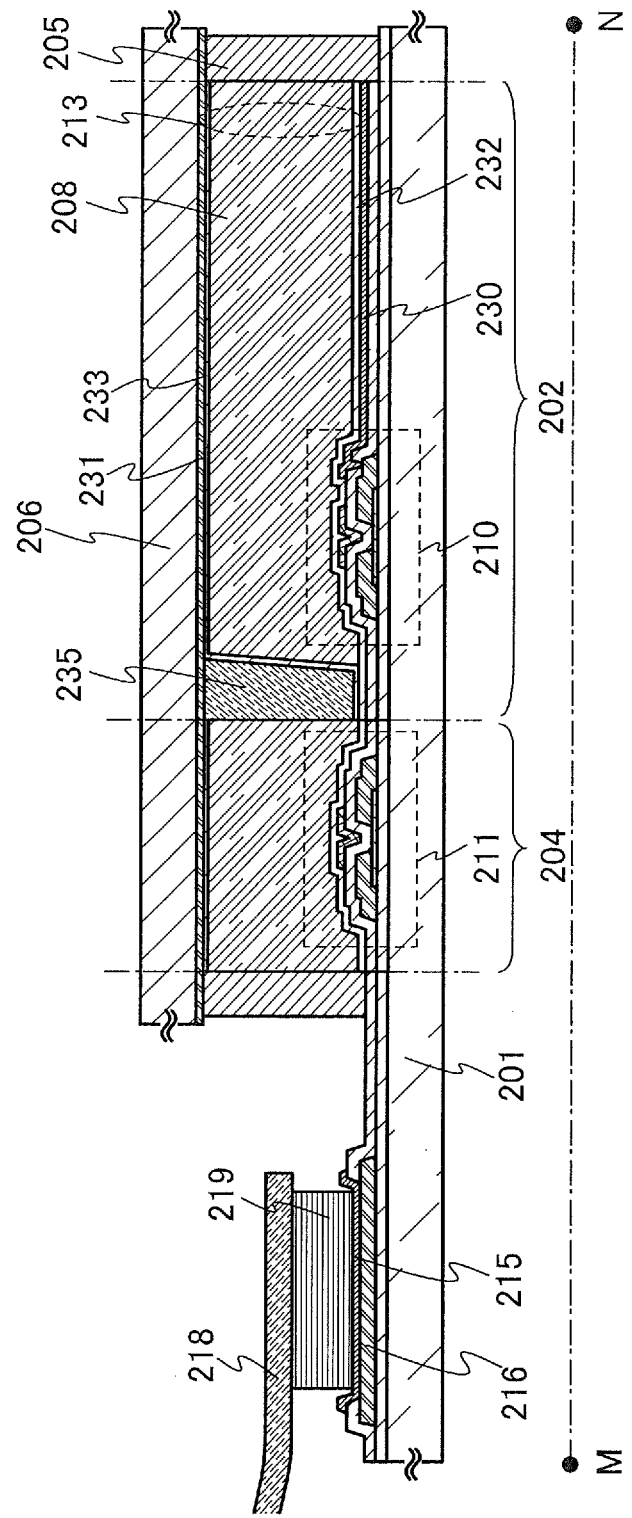
FIG. 9 illustrates one mode of a semiconductor device that is an embodiment of the present invention.
Figure 10:
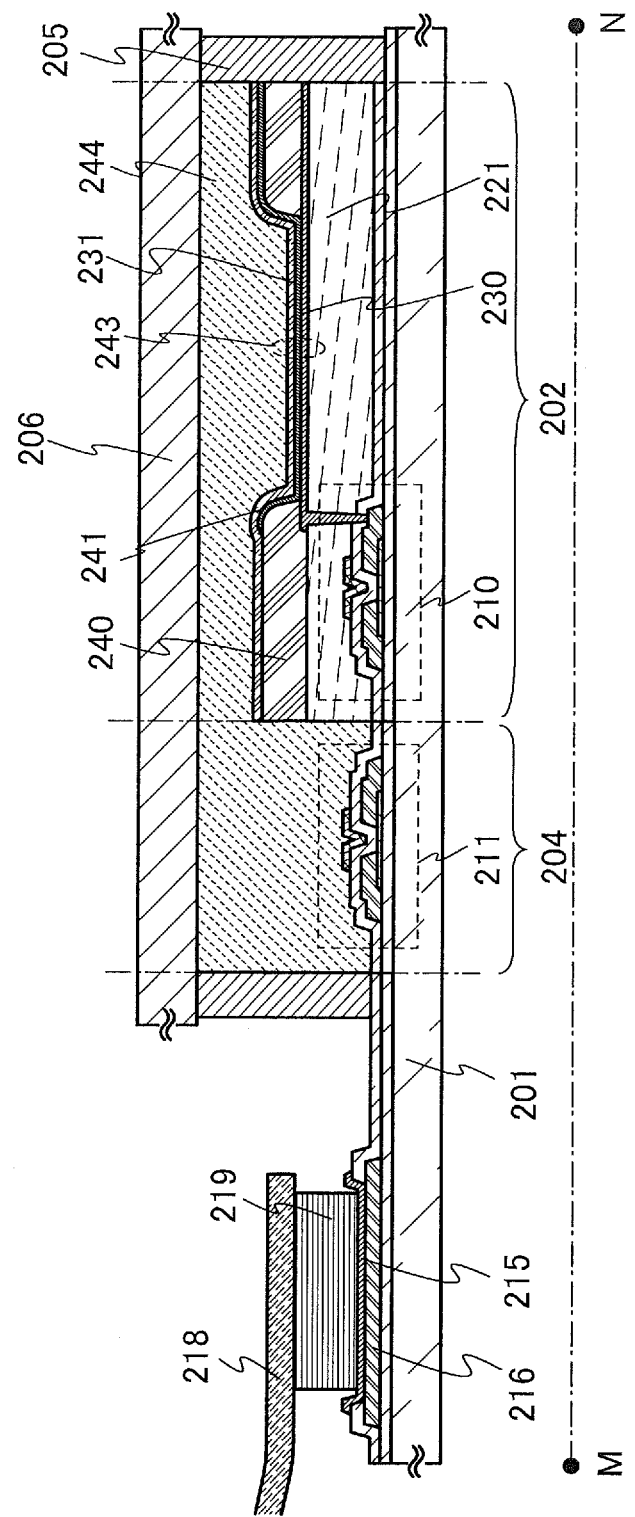
FIG. 10 illustrates one mode of a semiconductor device that is an embodiment of the present invention.
Figure 11:
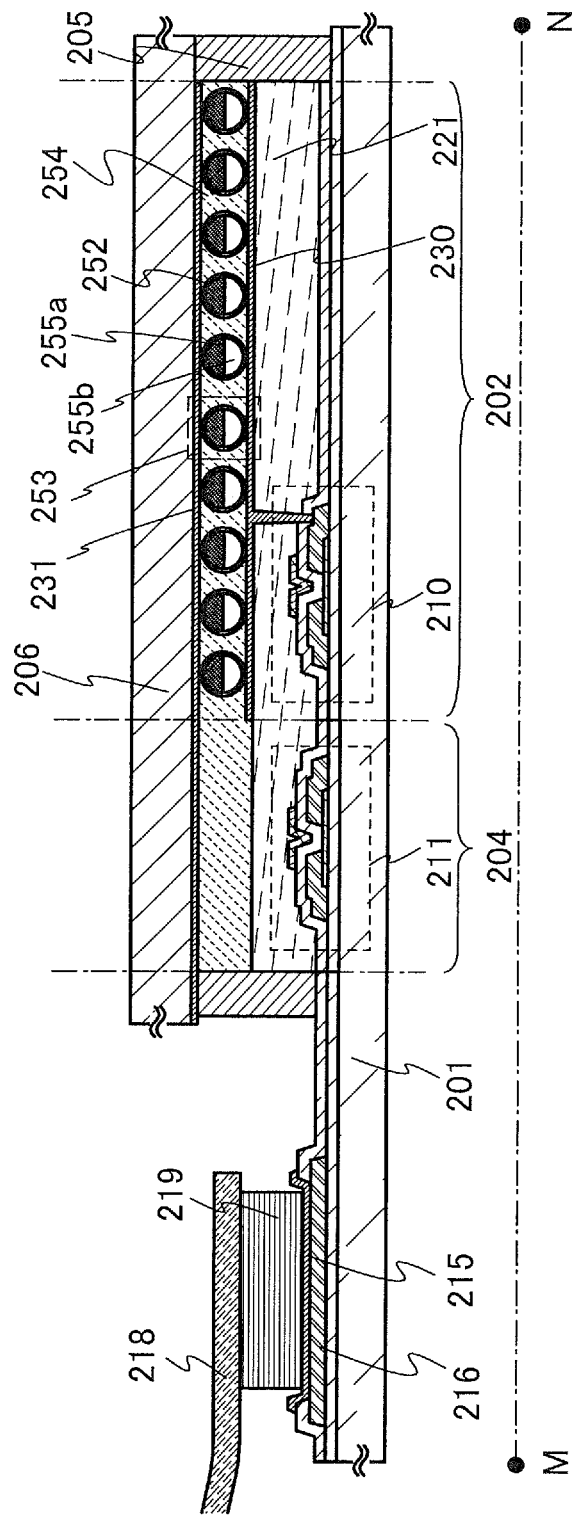
FIG. 11 illustrates one mode of a semiconductor device that is an embodiment of the present invention.

An embodiment of the semiconductor device is described with reference to FIG. 9, FIG. 10, and FIG. 11. FIG. 9, FIG. 10, and FIG. 11 correspond to cross-sectional views along line M-N in FIG. 8B.

As illustrated in FIG. 9 to FIG. 11, the semiconductor device includes a connection terminal electrode 215 and a terminal electrode 216. The connection terminal electrode 215 and the terminal electrode 216 are electrically connected to a terminal included in the FPC 218 through an anisotropic conductive layer 219.

The connection terminal electrode 215 is formed using the same conductive layer as a first electrode layer 230, and the terminal electrode 216 is formed using the same conductive layer as source and drain electrodes of a transistor 210 and a transistor 211.

The pixel portion 202 and the scan line driver circuit 204 provided over the first substrate 201 each include a plurality of transistors. FIG. 9, FIG. 10, and FIG. 11 each illustrate the transistor 210 included in the pixel portion 202 and the transistor 211 included in the scan line driver circuit 204.

In this embodiment, the transistor described in Embodiment 1 can be applied to the transistor 210 and the transistor 211. Variation in electric characteristics of the transistor 210 and the transistor 211 is suppressed and the transistor 210 and the transistor 211 are electrically stable. Therefore, highly-reliable semiconductor devices can be provided as the semiconductor devices illustrated in FIG. 9 to FIG. 11.

The transistor 210 provided in the pixel portion 202 is electrically connected to the display element to form a display panel. There is no particular limitation on the kind of the display element as long as display can be performed, and various kinds of display elements can be employed.

Note that an example of a liquid crystal display device using a liquid crystal element as a display element is described in FIG. 9. In FIG. 9, a liquid crystal element 213 which is a display element includes the first electrode layer 230, a second electrode layer 231, and a liquid crystal layer 208. Note that insulating layers 232 and 233 functioning as alignment layers are provided so that the liquid crystal layer 208 is provided therebetween. The second electrode layer 231 is provided on the second substrate 206 side, and the first electrode layer 230 and the second electrode layer 231 are stacked with the liquid crystal layer 208 provided therebetween.

A spacer 235 is a columnar spacer obtained by selective etching of an insulating layer and is provided in order to control the thickness (a cell gap) of the liquid crystal layer 208. Alternatively, a spherical spacer may be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. These liquid crystal materials exhibit a cholesteric phase, a smectic phase, a cubic phase, a chiral nematic phase, an isotropic phase, or the like depending on conditions.

Alternatively, a liquid crystal exhibiting a blue phase for which an alignment layer is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which a chiral material is mixed is used for the liquid crystal layer in order to improve the temperature range. The liquid crystal composition which includes a liquid crystal exhibiting a blue phase and a chiral agent has a short response time of 1 msec or less, has optical isotropy, which makes the alignment process unneeded, and has a small viewing angle dependence. In addition, since an alignment layer does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased.

The specific resistivity of the liquid crystal material is greater than or equal to $1\times10^9$ Ω·cm, preferably greater than or equal to $1\times10^{11}$ Ω·cm, still preferably greater than or equal to $1\times10^{12}$ Ω·cm. The value of the specific resistivity in this specification is measured at 20° C.

The size of storage capacitor formed in the liquid crystal display device is set considering the leakage current of the transistor provided in the pixel portion or the like so that charge can be held for a predetermined period. By using a transistor including a high-purity oxide semiconductor layer, it is enough to provide a storage capacitor having a capacitance that is less than or equal to ⅓, preferably less than or equal to ⅕ of a liquid crystal capacitance of each pixel.

In the transistor used in this embodiment, which uses a highly-purified oxide semiconductor layer, the current in an off state (the off-state current) can be made small. Thus, the holding period of an electric signal of an image signal or the like can be extended and an interval between writing operations can be set longer in the state where power supply is on. Accordingly, frequency of refresh operation can be reduced, which leads to an effect of suppressing power consumption.

The field-effect mobility of the transistor including a highly-purified oxide semiconductor layer used in this embodiment can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like can be used.

A normally black liquid crystal display device such as a transmissive liquid crystal display device utilizing a vertical alignment (VA) mode is preferable. The vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an ASV mode, and the like can be given. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

In addition, as a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. The present invention is not limited to the application to a display device for color display but can also be applied to a display device for monochrome display.

Alternatively, as the display element included in the display device, a light-emitting element utilizing EL can be used. Light-emitting elements using EL are categorized by whether a light-emitting material is an organic compound or an inorganic compound, and in general, the former is called an organic EL element and the latter is called an inorganic EL element.

In an organic EL element, by application of voltage to a light-emitting element, electrons and holes are separately injected from a pair of electrodes into a layer containing a light-emitting organic compound, so that current flows. Then, recombination of these carriers (the electrons and holes) makes the light-emitting organic compound to form an excited state and to emit light when it returns from the excited state to a ground state. Because of such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. The light-emitting element can have a top emission structure in which light emission is extracted through the surface opposite to the substrate; a bottom emission structure in which light emission is extracted through the surface on the substrate side; or a dual emission structure in which light emission is extracted through the surface opposite to the substrate and the surface on the substrate side, and a light-emitting element having any of these emission structures can be used.

An example of a light-emitting device in which a light-emitting element is used as a display element will be illustrated in FIG. 10. A light-emitting element 243 which is a display element is electrically connected to the transistor 210 provided in the pixel portion 202. Note that the structure of the light-emitting element 243 is, but not limited to, a stacked structure which includes the first electrode layer 230, an electroluminescent layer 241, and the second electrode layer 231. The structure of the light-emitting element 243 can be changed as appropriate depending on the direction in which light is extracted from the light-emitting element 243, or the like.

A partition 240 can be formed using an organic insulating material or an inorganic insulating material. It is particularly preferable that the partition 240 be formed using a photosensitive resin material to have an opening over the first electrode layer 230 so that a sidewall of the opening has a tilted surface with continuous curvature.

The electroluminescent layer 241 may be formed using either a single layer or a stack of plural layers.

In order to prevent oxygen, hydrogen, moisture, carbon dioxide, and the like from entering the light-emitting element 243, a protective layer may be formed over the second electrode layer 231 and the partition 240. As the protective layer, a silicon nitride layer, a silicon nitride oxide layer, a diamond like carbon (DLC) layer, an aluminum oxide layer, an aluminum nitride layer, or the like can be formed. In addition, in a space which is formed with the first substrate 201, the second substrate 206, and the sealant 205, a filler 244 is provided for sealing. In such a manner, it is preferable that the light-emitting element be packaged (sealed) with a protective film (such as a laminate film or an ultraviolet curable resin film) or a cover material with high air-tightness and little degasification so that the light-emitting element is not exposed to the outside air.

As the filler 244, an ultraviolet curable resin or a thermosetting resin can be used in addition to an inert gas such as nitrogen or argon. For example, polyvinyl chloride (PVC), an acrylic resin, polyimide, an epoxy resin, a silicone resin, polyvinyl butyral (PVB), or ethylene vinyl acetate (EVA) can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection layer. For example, antiglare treatment by which reflected light can be diffused by projections and depressions on the surface so as to reduce the glare can be performed.

Further, electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

FIG. 11 illustrates active matrix electronic paper as an embodiment of a semiconductor device. The electronic paper in FIG. 11 is an example of a display device using a twisting ball display system.

Between the first electrode layer 230 connected to the transistor 210 and the second electrode layer 231 provided for the second substrate 206, spherical particles 253 each of which includes a black region 255a, a white region 255b, and a cavity 252 which is filled with liquid around the black region 255a and the white region 255b, are provided. A space around the spherical particles 253 is filled with a filler 254 such as a resin. The second electrode layer 231 corresponds to a common electrode (counter electrode). The second electrode layer 231 is electrically connected to a common potential line.

Note that in FIG. 9 to FIG. 11, a flexible substrate as well as a glass substrate can be used as first substrate 201 and the second substrate 206. For example, a plastic substrate having light-transmitting properties can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The insulating layer 221 can be formed using an inorganic insulating material or an organic insulating material. Note that the insulating layer 221 formed using a heat-resistant organic insulating material such as an acrylic resin, polyimide, a benzocyclobutene resin, polyamide, or an epoxy resin is preferably used as a planarizing insulating layer. As well as such organic insulating materials, it is possible to use a low-dielectric constant material (a low-k material), a siloxane-based resin, phosphosilicate glass (PSG), borophosphosilicate glass (BPSG), or the like. Note that the insulating layer 221 may be formed by stacking a plurality of insulating layers formed using any of these materials.

There is no particular limitation on the method for forming the insulating layer 221, and the insulating layer 221 can be formed, depending on the material, by a sputtering method, a spin coating method, a dipping method, spray coating, a droplet discharge method (e.g., an inkjet method, screen printing, or offset printing), roll coating, curtain coating, knife coating, or the like.

The display device performs display by transmitting light from a light source or a display element. Therefore, the substrate and the thin films such as the insulating layer and the conductive layer provided for the pixel portion where light is transmitted have light-transmitting properties with respect to light in the visible-light wavelength range.

The first electrode layer 230 and the second electrode layer 231 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

The first electrode layer 230 and the second electrode layer 231 can be formed using a light-transmitting conductive material such as indium oxide including tungsten oxide, indium zinc oxide including tungsten oxide, indium oxide including titanium oxide, indium tin oxide including titanium oxide, indium tin oxide (hereinafter referred to as ITO), indium zinc oxide, or indium tin oxide to which silicon oxide is added.

The first electrode layer 230 and the second electrode layer 231 each can be formed using one or more kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

The first electrode layer 230 and the second electrode layer 231 can be formed using a conductive composition including a conductive high molecule (also referred to as a conductive polymer). As the conductive high molecule, a so-called π-electron conjugated conductive polymer can be used. For example, polyaniline or a derivative thereof, polypyrrole or a derivative thereof, polythiophene or a derivative thereof, a copolymer of more than two kinds of these materials, and the like can be given.

Since the transistor is easily broken due to static electricity or the like, a protective circuit for protecting the driver circuit is preferably provided. The protective circuit is preferably formed using a nonlinear element.

As described above, by using any of the transistors described in Embodiment 1, a semiconductor device having a high reliability can be provided. Note that the transistor described in Embodiment 1 can be applied to not only the semiconductor devices having the display functions described above but also semiconductor devices having a variety of functions, such as a power device which is mounted on a power supply circuit, a semiconductor integrated circuit such as an LSI, and a semiconductor device having an image sensor function of reading information of an object.

The methods and structures described in this embodiment can be combined as appropriate with any of the methods and structures described in the other embodiments.

Embodiment 3

A semiconductor device which is an embodiment of the present invention can be applied to a variety of electronic appliances (including game machines). Examples of electronic appliances include a television set (also referred to as a television or a television receiver), a monitor of a computer or the like, a camera such as a digital camera or a digital video camera, a digital photo frame, a mobile phone set (also referred to as a mobile phone or a mobile phone device), a portable game console, a portable information terminal, an audio reproducing device, a large-sized game machine such as a pachinko machine, and the like. Examples of electronic appliances each including the semiconductor device described in the above embodiment will be described.

Figure 12A:
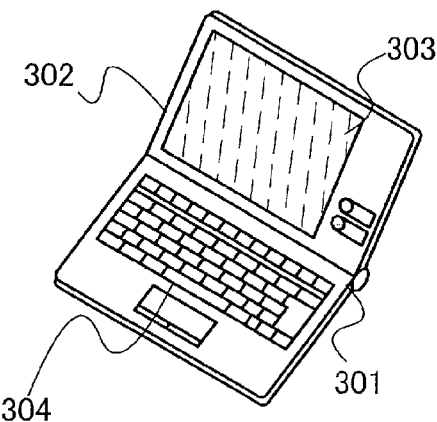
FIGS. 12A to 12F each illustrate an electronic appliance as a semiconductor device that is an embodiment of the present invention.

FIG. 12A illustrates a notebook personal computer including a main body 301, a housing 302, a display portion 303, a keyboard 304, and the like. By applying the semiconductor device described in Embodiment 1 or 2, the notebook personal computer can have high reliability.

Figure 12B:
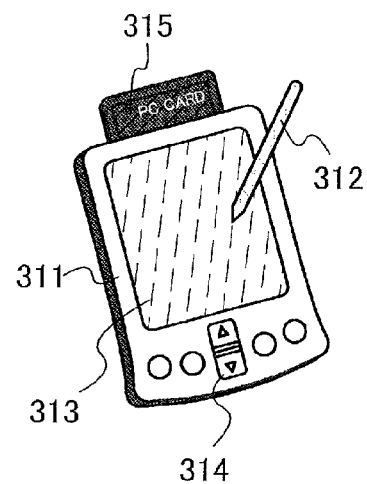

FIG. 12B illustrates a personal digital assistant (PDA) including a main body 311 provided with a display portion 313, an external interface 315, operational keys 314, and the like. A stylus 312 is included as an accessory for operation. By applying the semiconductor device described in Embodiment 1 or 2, the personal digital assistant (PDA) can have higher reliability.

Figure 12C:
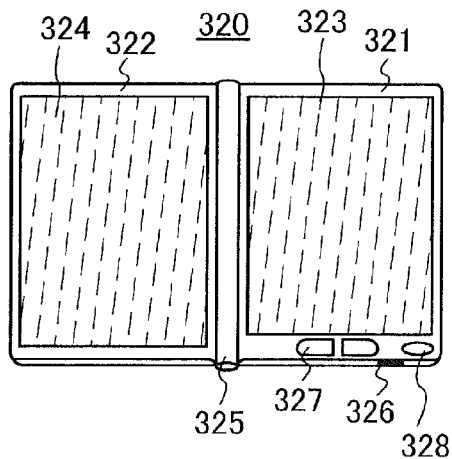

FIG. 12C is an example of an e-book reader. For example, an e-book reader 320 includes two housings: a housing 321 and a housing 322. The housing 321 and the housing 322 are combined with a hinge 325 so that the e-book reader 320 can be opened and closed with the hinge 325 as an axis. With such a structure, the e-book reader 320 can operate like a paper book.

A display portion 323 is incorporated in the housing 321 and a display portion 324 is incorporated in the housing 322. The display portion 323 and the display portion 324 may be configured to display one image or different images. In the case where the display portion 323 and the display portion 324 display different images, for example, a display portion on the right side (the display portion 323 in FIG. 12C) can display text and a display portion on the left side (the display portion 324 in FIG. 12C) can display graphics. The semiconductor device described in Embodiment 1 or 2 is applied, whereby a highly reliable e-book reader can be provided.

FIG. 12C illustrates the case where the housing 321 includes an operating portion and the like. For example, the housing 321 includes a power button 326, a control key 327, a speaker 328, and the like. With the operation key 327, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader 320 may have a function of an electronic dictionary.

The e-book reader 320 may send and receive data wirelessly. Through wireless communication, desired book data or the like can be purchased and downloaded from an electronic book server.

Figure 12D:
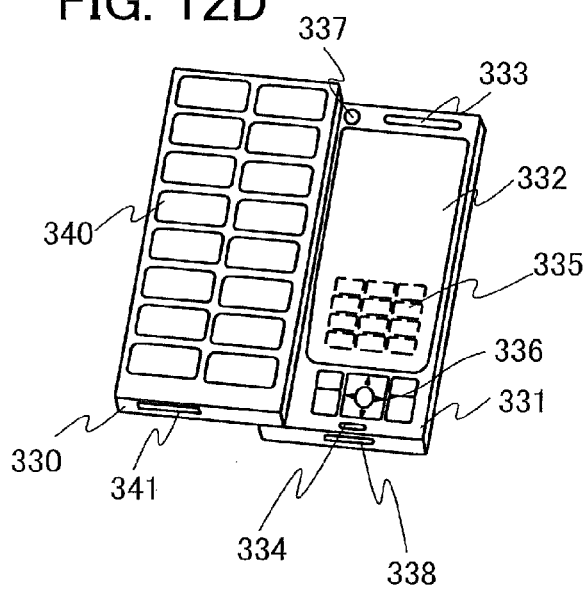

FIG. 12D is a portable information terminal including two housings, a housing 330 and a housing 331. The housing 331 includes a display panel 332, a speaker 333, a microphone 334, a pointing device 336, a camera lens 337, an external connection terminal 338, and the like. The housing 330 is provided with a solar cell 340 for charging the portable information terminal, an external memory slot 341, and the like. Further, an antenna is incorporated in the housing 331. By applying the semiconductor device described in Embodiment 1 or 2, the portable information terminal can have high reliability.

Further, the display panel 332 is provided with a touch screen. A plurality of operation keys 335 which is displayed is indicated by dashed lines in FIG. 12D. Note that a boosting circuit by which a voltage output from the solar cell 340 is increased to be sufficiently high for each circuit is also included.

The display orientation of the display panel 332 changes as appropriate in accordance with the application mode. Further, the camera lens 337 is provided on the same surface as the display panel 332, and thus it can be used as a video phone. The speaker 333 and the microphone 334 can be used for videophone calls, recording and playing sound, and the like as well as voice calls. The housing 330 and the housing 331 in a state where they are developed as illustrated in FIG. 12D can be slid so that one is lapped over the other. Therefore, the size of the mobile phone set can be reduced, which makes the mobile phone set suitable for being carried around The external connection terminal 338 can be connected to an AC adapter and various types of cables such as a USB cable, and charging and data communication with a personal computer are possible. Moreover, a larger amount of data can be saved and moved by inserting a recording medium to the external memory slot 341.

Further, in addition to the above functions, an infrared communication function, a television reception function, or the like may be provided.

Figure 12E:
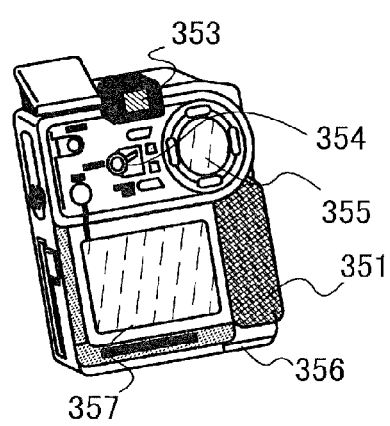

FIG. 12E is a digital video camera including a main body 351, a display portion A 357, an eyepiece 353, an operation switch 354, a display portion B 355, a battery 356, and the like. By applying the semiconductor device described in Embodiment 1 or 2, the digital video camera can have high reliability.

Figure 12F:
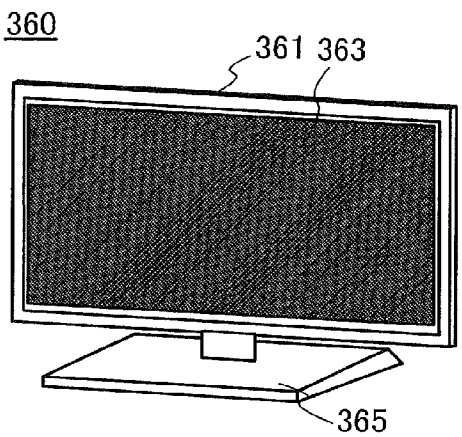

FIG. 12F illustrates an example of a television set. In a television set 360, a display portion 363 is incorporated in a housing 361. Images can be displayed on the display portion 363. Here, the housing 361 is supported on a stand 365. By applying the semiconductor device described in Embodiment 1 or 2, the television set 360 can have high reliability.

The television set 360 can be operated by an operation switch provided for the housing 361 or a separate remote controller. Further, the remote controller may be provided with a display portion for displaying data output from the remote controller.

Note that the television set 360 is provided with a receiver, a modem, and the like. Moreover, when the display device is connected to a communication network with or without wires via the modem, one-way (from a sender to a receiver) or two-way (between a sender and a receiver or between receivers) information communication can be performed.

The methods and structures described in this embodiment can be combined as appropriate with any of the methods and structures described in the other embodiments.

Example 1

In this example, results of analysis by RBS and HFS performed on oxygen-excess silicon oxide layers will be described. The oxygen-excess silicon oxide layer is to be used for a base insulating layer or a protective insulating layer provided in a semiconductor device which is an embodiment of the present invention.

Conditions of the analysis by RBS and HFS in this example are given below.
Measurement apparatus: 3S-R10 manufactured by NEC (National Electrostatics Corporation) and RBS-400 manufactured by CEA (Charles Evans & Associates)
Incident ion: 2.275 MeV $^4$He$^{2+}$ (RBS and HFS)
Beam diameter: 1 mm to 2 mm φ
RBS detection angle
Normal angle: 160°
Grazing angle: 113° or less
HFS detection angle
Grazing angle: 30°

For the analysis in this embodiment, silicon oxide layers were formed over silicon wafers each of which having a thickness of 0.3 mm.

Conditions of the samples for the measurement in this example are described below.
Formation conditions of Sample 1 are as follows:
Film: silicon oxide
Deposition method: RF sputtering method
Target: quartz target
Deposition gas: Ar (40 sccm) and $O_2$ (10 sccm)
Power: 1.5 kW (13.56 MHz)
Pressure: 0.4 Pa
T-S distance: 60 mm
Substrate temperature in deposition: 100° C.
Thickness: 150 nm
Formation conditions of Sample 2 are as follows:
Film: silicon oxide
Deposition method: RF sputtering method
Target: quartz target
Deposition gas: Ar (25 sccm) and $O_2$ (25 sccm)
Power: 1.5 kW (13.56 MHz)
Pressure: 0.4 Pa
T-S distance: 60 mm
Substrate temperature in deposition: 100° C.
Thickness: 200 nm Results of the analysis by RBS and HFS on compositions of the silicon oxide films of Sample 1 and Sample 2 are shown in Table 1.

TABLE 1

| Name of | Quantitative value [atomic %] | | | | Ratio of (O/Si) |
|---|---|---|---|---|---|
| Samples | H | O | Si | Ar | (X of $SiO_X$) |
| Sample 1 | 0.1 | 66.5 | 32.9 | 0.5 | 2.02 |
| Sample 2 | 0.2 | 65.9 | 33.0 | 0.9 | 2.00 |

According to Table 1, in order to obtain oxygen-excess silicon oxide ($SiO_X$ (X>2)), it is preferable that the ratio of $O_2/(O_2+Ar)$ in a deposition gas flow rate be greater than 20%.

Example 2

In this example, a transistor manufactured according to an embodiment of the present invention will be described.

Figure 16:
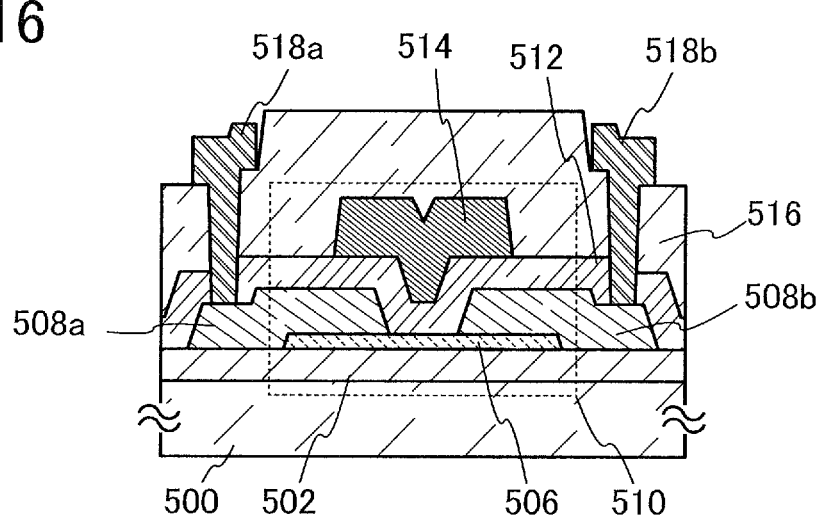
FIG. 16 illustrates a structure of a semiconductor device used in an example of the present invention.

FIG. 16 illustrates the structure of the transistor in this example.

The transistor illustrated in FIG. 16 includes a base insulating layer 502 provided over a substrate 500; an oxide semiconductor layer 506; a source electrode 508a and a drain electrode 508b; a gate insulating layer 512 provided over the source electrode 508a and the drain electrode 508b; a gate electrode 514 provided over the gate insulating layer 512; a protective insulating layer 516 provided over the gate electrode 514; and a source wiring 518a and a drain wiring 518b connected to the source electrode 508a and the drain electrode 508b respectively, with the protective insulating layer 516 provided therebetween.

In this example, a glass substrate with a thickness of 0.7 mm was used as the substrate 500; a silicon oxide layer with a thickness of 300 nm was formed as the base insulating layer 502; an In—Ga—Zn—O-based non-single-crystal layer with a thickness of 30 nm was formed as the oxide semiconductor layer 506; a tungsten layer with a thickness of 100 nm was formed as the source electrode 508a and the drain electrode 508b; a silicon oxynitride layer with a thickness of 15 nm was formed as the gate insulating layer 512; a tantalum nitride layer and a tungsten layer with their respective thicknesses of 30 nm and 370 nm were stacked as the gate electrode 514; a silicon oxide layer with a thickness of 300 nm was formed as the protective insulating layer 516; and a titanium layer, an aluminum layer, and a titanium layer with their respective thicknesses of 50 nm, 100 nm, and 5 nm were stacked as the source wiring 518*a* and the drain wiring 518*b*.

In the transistor of this example, oxygen-excess silicon oxide ($SiO_X$ (X>2)) was used for the base insulating layer 502, whereby change in the threshold voltage after a BT treatment and a light bias test was suppressed.

The other formation conditions of the silicon oxide layer are described below.
Deposition method: RF sputtering method
Target: quartz target
Deposition gas: Ar (25 sccm) and $O_2$ (25 sccm)
Power: 1.5 kW (13.56 MHz)
Pressure: 0.4 Pa
T-S distance: 60 mm
Substrate temperature: 100° C.

Formation conditions of the oxide semiconductor layer 506 in the transistor of this example are described below.
Deposition method: DC sputtering method
Target: In—Ga—Zn—O ($In_2O_3$:$Ga_2O_3$:ZnO=1:1:2 [molar ratio]) target
Deposition gas: Ar (30 sccm) and $O_2$ (15 sccm)
Power: 0.5 kW (DC)
Pressure: 0.4 Pa
T-S distance: 60 mm
Substrate temperature: 200° C.

The oxide semiconductor layer 506 was formed and then heat treatment was performed in a nitrogen atmosphere at 350° C. for one hour using a resistance heating furnace.

Next, a BT test in this example will be described. The transistor used for the BT test has a channel length L of 3 µm and a channel width of 50 µm. In this example, Ids-Vgs measurement of the transistor was performed, where a substrate temperature was set to 25° C. and a voltage Vds between the source electrode and the drain electrode was set to 3V.

Next, a substrate-stage temperature was set to 150° C., the source electrode of the transistor was set to 0 V, and the drain electrode thereof was set to 0.1 V. Then, positive voltage was kept being applied to the gate electrode for one hour so that the intensity of an electric field applied to the gate insulating layer was 2 MV/cm. Subsequently, the voltage of the gate electrode was set to 0 V. Then, Ids-Vgs measurement of the transistor was performed, where the substrate temperature was set to 25° C. and the voltage Vds between the source electrode and the drain electrode was set to 3 V. Results of the Ids-Vgs measurements obtained before and after the BT test are shown in FIG. 13A.

Figure 13A:
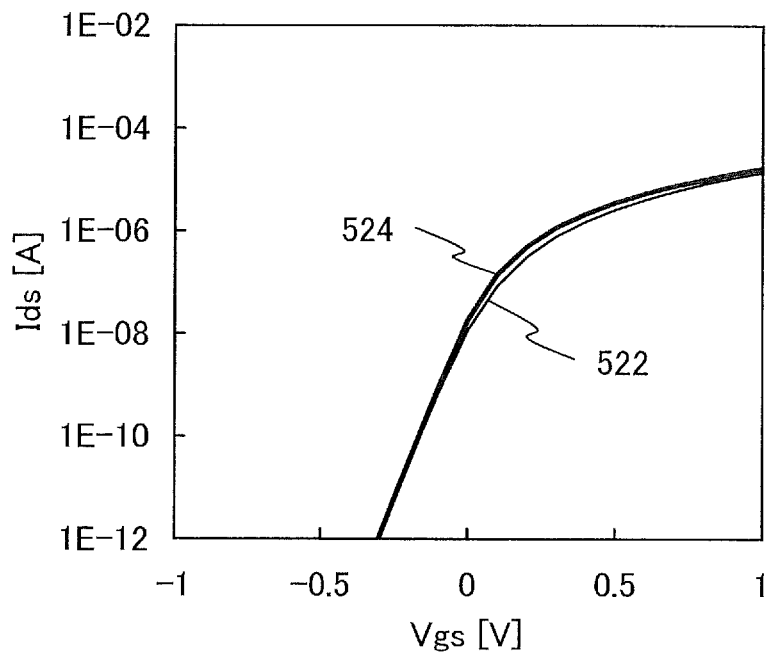
FIGS. 13A and 13B each show transistor characteristics of a semiconductor device that is an example of the present invention.

In FIG. 13A, a thin line 522 denotes a result of the Ids-Vgs measurement of the transistor obtained before the BT test, and a thick line 524 denotes a result of the Ids-Vgs measurement of the transistor obtained after the BT test. The threshold voltage obtained after the BT test shifts by 0.10 V in the positive direction as compared with the threshold voltage obtained before the BT test.

Similarly, another transistor was used and Ids-Vgs measurement was performed, where the substrate temperature was set to 25° C. and the voltage Vds between the source electrode and the drain electrode was set to 3 V. The transistor has a channel length L of 3 µm and a channel width of 50 µm.

Next, the substrate-stage temperature was set to 150° C., and the source electrode and the drain electrode of the transistor were set to 0 V and 0.1 V, respectively. Then, negative voltage was kept being applied to the gate electrode for one hour so that the intensity of an electric field applied to the gate insulating layer was 2 MV/cm. The voltage of the gate electrode was set to 0 V. Then, Ids-Vgs measurement of the transistor was performed, where the substrate temperature was set to 25° C. and the voltage Vds between the source electrode and the drain electrode was set to 3 V. Results of the Ids-Vgs measurements obtained before and after the BT test are shown in FIG. 13B.

Figure 13B:
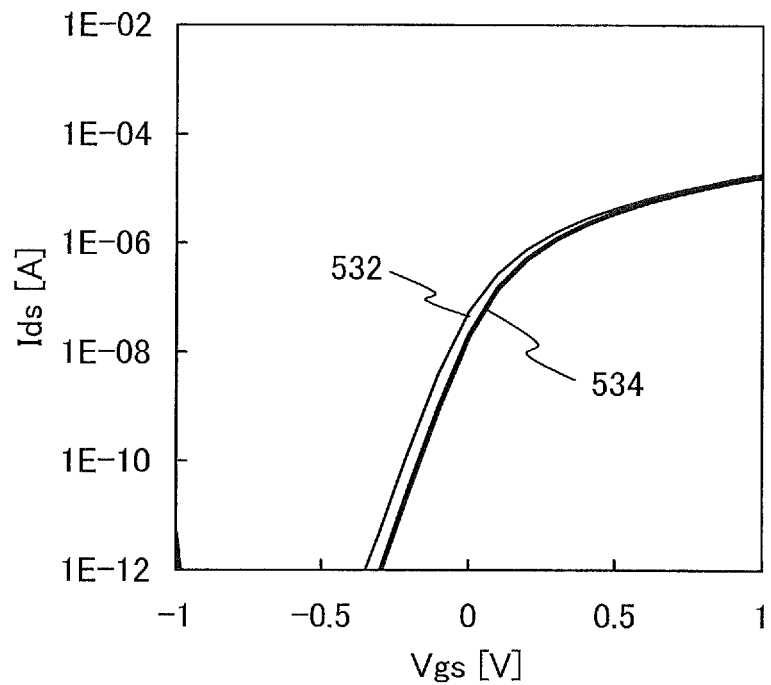

In FIG. 13B, a thin line 532 denotes a result of the Ids-Vgs measurement of the transistor obtained before the BT test, and a thick line 534 denotes a result of the Ids-Vgs measurement of the transistor obtained after the BT test. The threshold voltage obtained after the BT test shifts by 0.07 V in the negative direction as compared with the threshold voltage obtained before the BT test.

Figure 14:
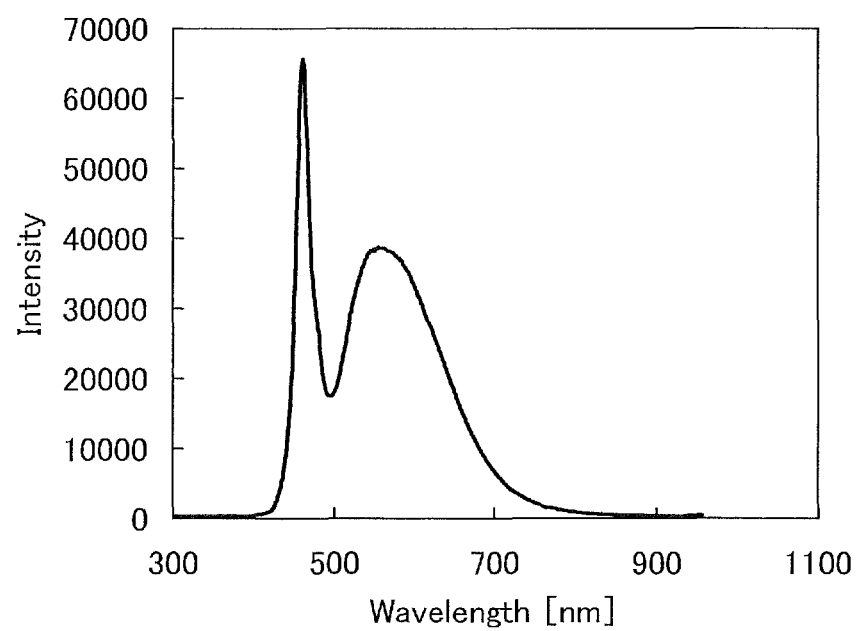
FIG. 14 shows an emission spectrum of a light source used in an example of the present invention.

Next, a light bias test in this example will be described. A white LED was used as a light source in the light bias test. An emission spectrum of the white LED is shown in FIG. 14.

A transistor used for the light bias test has a channel length L of 3 µm and a channel width of 50 µm. In this example, first, Ids-Vgs measurement of the transistor in a dark condition was performed, where the substrate temperature was set to 25° C. and the voltage Vds between the source electrode and the drain electrode was set to 3 V.

Figure 15A:
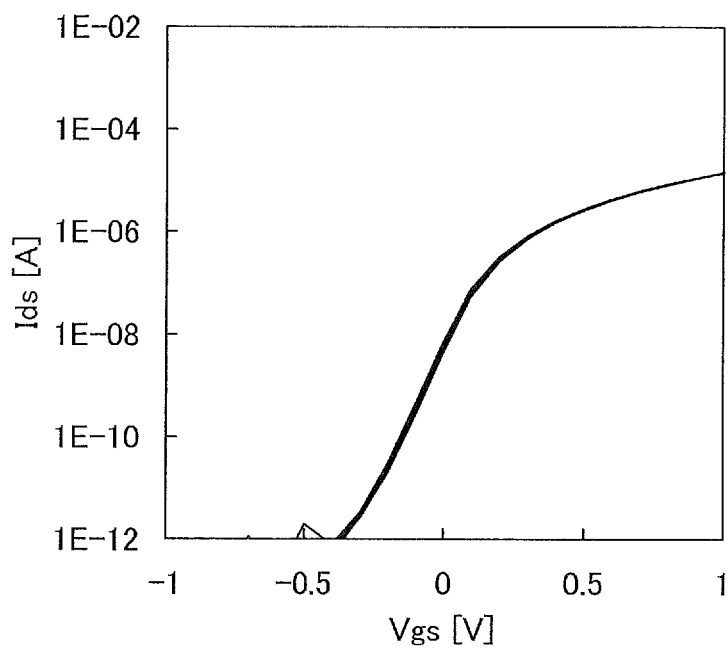
FIGS. 15A and 15B each show transistor characteristics of a semiconductor device that is an example of the present invention.

Next, light irradiation was performed from a rear surface side of the substrate with light at an intensity of 36000 133 using a white LED light, and the source electrode and the drain electrode of the transistor were set to 0 V and 0.1 V, respectively. Then, positive voltage was kept being applied to the gate electrode for a given time so that the intensity of an electric field applied to the gate insulating layer was 2 MV/cm. The voltage of the gate electrode was set to 0 V. Then, in a dark condition, Ids-Vgs measurement of the transistor was performed, where the voltage Vds between the source electrode and the drain electrode was set to 3 V. FIG. 15A shows results of the Ids-Vgs measurements obtained before the light bias tests and after the light bias tests at light-bias test times of 100 seconds, 300 seconds, 600 seconds, 1000 seconds, 1800 seconds, and 3600 seconds.

The results of the Ids-Vgs measurements obtained before and after the light bias test in FIG. 15A show that the threshold voltage shifts by 0.02 V at the maximum in the positive direction after the light bias test.

Similarly, another transistor was used, and first, Ids-Vgs measurement of the transistor in a dark condition was performed, where the substrate temperature was set to 25° C. and the voltage Vds between the source electrode and the drain electrode was set to 3 V. The transistor has a channel length L of 3 µm and a channel width of 50 µm.

Next, light irradiation was performed from a rear surface side of the substrate with light at an intensity of 36000 1× using a white LED light, and the source electrode and the drain electrode of the transistor were set to 0 V and 0.1 V, respectively. Then, negative voltage was kept being applied to the gate electrode for a given time so that the intensity of an electric field applied to the gate insulating layer is 2 MV/cm. The voltage of the gate electrode was set to 0 V. Then, in a dark condition, Ids-Vgs measurement of the transistor was performed, where the voltage Vds between the source electrode and the drain electrode was set to 3 V. Results of the Ids-Vgs measurements obtained before the light bias tests and after the light bias tests at light-bias test times of 100 seconds, 300 seconds, 600 seconds, 1000 seconds, 1800 seconds, and 3600 seconds are shown in FIG. 15B.

Figure 15B:
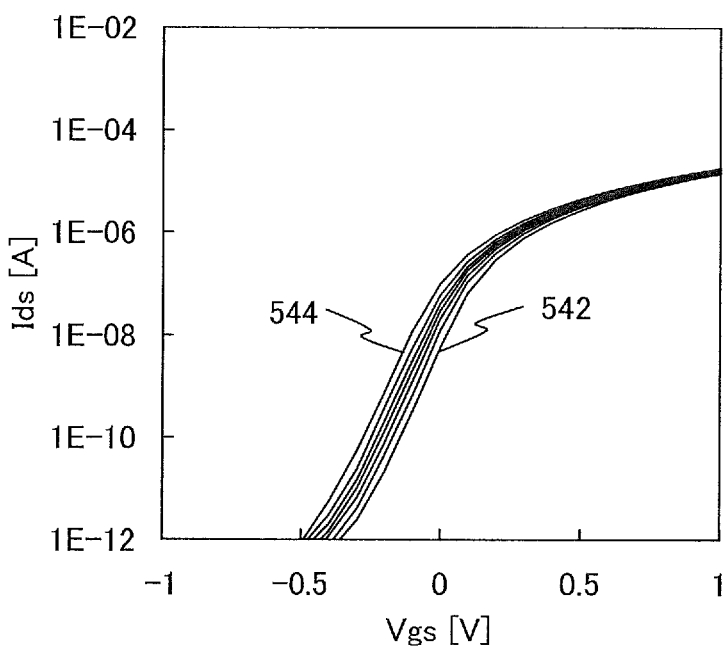

In FIG. 15B, a thin line 542 denotes a result of the Ids-Vgs measurement of the transistor obtained before the light bias test, and a thin line 544 denotes a result of the Ids-Vgs measurement of the transistor obtained after the light bias test for 3600 seconds. The threshold voltage obtained after the light bias test performed for 3600 seconds shifts by 0.11 V in the negative direction as compared with the threshold voltage obtained before the light bias test.

As described above, it is found that the change in the threshold voltage of the transistor of this example after the BT test or after the light bias test is small.

EXPLANATION OF REFERENCE

100: substrate; 102: base insulating layer; 106: oxide semiconductor layer; 108a: source electrode; 108b: drain electrode; 112: gate insulating layer; 114: gate electrode; 122a: source region; 122b: drain region; 124: protective insulating layer; 126: channel region; 151: transistor; 152: transistor; 153: transistor; 154: transistor; 155: transistor; 201: first substrate; 202: pixel portion; 203: signal line driver circuit; 204: scan line driver circuit; 205: sealant; 206: second substrate; 208: liquid crystal layer; 210: transistor; 211: transistor; 213: liquid crystal element; 215: connection terminal electrode; 216: terminal electrode; 218: FPC; 218a: FPC; 218b: FPC; 219: anisotropic conductive layer; 221: insulating layer; 230: first electrode layer; 231: second electrode layer; 232: insulating layer; 233: insulating layer; 235: spacer; 240: partition; 241: electroluminescent layer; 243: light-emitting element; 244: filler; 252: cavity; 253: spherical particle; 254: filler; 255a: black region; 255b: white region; 301: main body; 302: housing; 303: display portion; 304: keyboard; 311: main body; 312: stylus; 313: display portion; 314: operational key; 315: external interface; 320: e-book reader; 321: housing; 322: housing; 323: display portion; 324: display portion; 325: hinge; 326: power button; 327: operation key; 328: speaker; 330: housing; 331: housing; 332: display panel; 333: speaker; 334: microphone; 335: operation key; 336: pointing device; 337: camera lens; 338: external connection terminal; 340: solar cell; 341: external memory slot; 351: main body; 353: eyepiece; 354: operation switch; 355: display portion B; 356: battery; 357: display portion A; 360: television set; 361: housing; 363: display portion; 365: stand; 500: substrate; 502: base insulating layer; 506: oxide semiconductor layer; 508a: source electrode; 508b: drain electrode; 512: gate insulating layer; 514: gate electrode; 516: protective insulating layer; 518a: source wiring; 518b: drain wiring; 522: thin line; 524: thick line; 532: thin line; 534: thick line; 542: thin line; 544: thin line.

This application is based on Japanese Patent Application serial no. 2010-134338 filed with Japan Patent Office on Jun. 11, 2010, the entire contents of which are hereby incorporated by reference.

The invention claimed is:

1. A semiconductor device comprising:
   a first insulating layer comprising silicon and oxygen over a substrate;
   an oxide semiconductor layer over and in contact with the first insulating layer;
   a gate electrode over the oxide semiconductor layer;
   a protective insulating layer over the gate electrode, the protective insulating layer comprising an opening; and
   a source electrode and a drain electrode electrically connected to the oxide semiconductor layer through the opening,
   wherein the number of oxygen atoms per unit volume of the first insulating layer is more than twice the number of silicon atoms per unit volume of the first insulating layer.

2. The semiconductor device according to claim 1, further comprising a second insulating layer over the oxide semiconductor layer,
   wherein the number of oxygen atoms per unit volume of the second insulating layer is more than twice the number of silicon atoms per unit volume of the second insulating layer.

3. The semiconductor device according to claim 1, wherein the oxide semiconductor layer contains hydrogen at a concentration of less than $1 \times 10^{18}$ cm$^{-3}$.

4. The semiconductor device according to claim 1, wherein a carrier concentration of the oxide semiconductor layer is less than $1 \times 10^{14}$ cm$^{-3}$.

5. The semiconductor device according to claim 1, wherein the first insulating layer is a silicon oxide layer.

6. A method for manufacturing a semiconductor device, comprising the steps of:
   forming a first insulating layer comprising silicon and oxygen over a substrate;
   forming an oxide semiconductor layer over and in contact with the first insulating layer;
   forming a gate electrode over the oxide semiconductor layer;
   forming a protective insulating layer over the gate electrode, the protective insulating layer comprising an opening; and
   forming a source electrode and a drain electrode electrically connected to the oxide semiconductor layer through the opening,
   wherein the number of oxygen atoms per unit volume of the first insulating layer is more than twice the number of silicon atoms per unit volume of the first insulating layer.

7. The method for manufacturing the semiconductor device according to claim 6, wherein the number of silicon atoms and the number of oxygen atoms per unit volume of the first insulating layer are measured by Rutherford backscattering spectrometry.

8. The method for manufacturing the semiconductor device according to claim 6, wherein the oxide semiconductor layer contains hydrogen at a concentration of less than $1 \times 10^{18}$ cm$^{-3}$.

9. The method for manufacturing the semiconductor device according to claim 6, wherein a carrier concentration of the oxide semiconductor layer is less than $1 \times 10^{14}$ cm$^{-3}$.

10. The method for manufacturing the semiconductor device according to claim 6, wherein the first insulating layer is a silicon oxide layer.

11. The method for manufacturing the semiconductor device according to claim 6, further comprising a step of performing a heat treatment in which an excess of oxygen in the first insulating layer is supplied to the oxide semiconductor layer.

12. A method for manufacturing a semiconductor device, comprising the steps of:
    forming a first insulating layer comprising silicon and oxygen over a substrate;
    forming an oxide semiconductor layer over and in contact with the first insulating layer;
    forming a second insulating layer comprising silicon and oxygen over and in contact with the oxide semiconductor layer;
    forming a gate electrode over the oxide semiconductor layer;

forming a protective insulating layer over the gate electrode, the protective insulating layer comprising an opening; and forming a source electrode and a drain electrode electrically connected to the oxide semiconductor layer through the opening, wherein the number of oxygen atoms per unit volume of the first insulating layer is more than twice the number of silicon atoms per unit volume of the first insulating layer, and wherein the number of oxygen atoms per unit volume of the second insulating layer is more than twice the number of silicon atoms per unit volume of the second insulating layer.

13. The method for manufacturing the semiconductor device according to claim 12, wherein the number of silicon atoms and the number of oxygen atoms per unit volume of the first insulating layer or the second insulating layer are measured by Rutherford backscattering spectrometry.

14. The method for manufacturing the semiconductor device according to claim 12, wherein the oxide semiconductor layer contains hydrogen at a concentration of less than $1 \times 10^{18}$ cm$^{-3}$.

15. The method for manufacturing the semiconductor device according to claim 12, wherein a carrier concentration of the oxide semiconductor layer is less than $1 \times 10^{14}$ cm$^{-3}$.

16. The method for manufacturing the semiconductor device according to claim 12, wherein the first insulating layer or the second insulating layer is a silicon oxide layer.

17. The method for manufacturing the semiconductor device according to claim 12, further comprising a step of performing a heat treatment in which an excess of oxygen in the first insulating layer is supplied to the oxide semiconductor layer.

18. The method for manufacturing the semiconductor device according to claim 12, wherein the second insulating layer further includes an aluminum oxide layer.

* * * * *